(12) United States Patent
Kim et al.

(10) Patent No.: US 10,483,281 B2
(45) Date of Patent: *Nov. 19, 2019

(54) SEMICONDUCTOR MEMORY DEVICE

(71) Applicant: SK hynix Inc., Gyeonggi-do (KR)

(72) Inventors: Yung Jun Kim, Seoul (KR); Suk Goo Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/189,625

(22) Filed: Nov. 13, 2018

(65) Prior Publication Data

US 2019/0081073 A1 Mar. 14, 2019

Related U.S. Application Data

(63) Continuation of application No. 15/635,276, filed on Jun. 28, 2017, now Pat. No. 10,163,927.

(30) Foreign Application Priority Data

Nov. 4, 2016 (KR) ........................ 10-2016-0146710

(51) Int. Cl.

| | |
|---|---|
| *H01L 27/11582* | (2017.01) |
| *G11C 5/02* | (2006.01) |
| *H01L 27/11565* | (2017.01) |
| *H01L 27/1157* | (2017.01) |
| *H01L 27/11575* | (2017.01) |
| *H01L 23/522* | (2006.01) |
| *H01L 23/528* | (2006.01) |
| *H01L 27/11568* | (2017.01) |
| *H01L 27/11573* | (2017.01) |
| *G11C 7/18* | (2006.01) |
| *G11C 16/04* | (2006.01) |
| *G11C 16/06* | (2006.01) |

(52) U.S. Cl.
CPC ........ *H01L 27/11582* (2013.01); *G11C 5/025* (2013.01); *H01L 23/5226* (2013.01); *H01L 23/5283* (2013.01); *H01L 27/1157* (2013.01); *H01L 27/11565* (2013.01); *H01L 27/11568* (2013.01); *H01L 27/11573* (2013.01); *H01L 27/11575* (2013.01); *G11C 7/18* (2013.01); *G11C 16/0466* (2013.01); *G11C 16/06* (2013.01)

(58) Field of Classification Search
None
See application file for complete search history.

(56) References Cited

U.S. PATENT DOCUMENTS

| | | | |
|---|---|---|---|
| 5,864,496 A * | 1/1999 | Mueller | G11C 7/18 365/69 |
| 2003/0102515 A1* | 6/2003 | Tran | H01L 27/10808 257/390 |

(Continued)

*Primary Examiner* — Sitaramarao S Yechuri
(74) *Attorney, Agent, or Firm* — IP & T Group LLP

(57) ABSTRACT

A semiconductor memory device includes a cell array region formed on a substrate, a word line contact region, and a page buffer region coupled to the cell array region through bit lines, wherein at least one of the bit lines has a curved structure toward the word line contact region. According to an embodiment, a misalignment between a cell plug and a contact plug caused by a natural cell plug bending phenomenon may be reduced to improve operational reliability of a semiconductor memory device.

20 Claims, 14 Drawing Sheets

(56) References Cited

U.S. PATENT DOCUMENTS

| | | | | |
|---|---|---|---|---|
| 2005/0012125 A1* | 1/2005 | Summerfelt | ...... | H01L 27/11502 |
| | | | | 257/295 |
| 2009/0121271 A1* | 5/2009 | Son | ...... | H01L 21/8221 |
| | | | | 257/315 |
| 2009/0185423 A1* | 7/2009 | Iwai | ...... | G11C 16/0483 |
| | | | | 365/185.12 |
| 2014/0097484 A1* | 4/2014 | Seol | ...... | H01L 29/42332 |
| | | | | 257/324 |

* cited by examiner

SEMICONDUCTOR MEMORY DEVICE

CROSS-REFERENCE TO RELATED APPLICATION

This application is a continuation of U.S. patent application Ser. No. 15/635,276 filed on Jun. 28, 2017, which claims priority under 35 U.S.C. § 119(a) to Korean patent application number 10-2016-0146710, filed on Nov. 4, 2016. The disclosure of each of the foregoing application is incorporated herein by reference in its entirety.

BACKGROUND

Field of Invention

Various embodiments of the invention relate generally to a semiconductor memory device, and more particularly, to a semiconductor memory device capable of improving operational reliability.

Description of Related Art

Semiconductor memory devices may include a plurality of memory cells capable of storing data.

Three-dimensional semiconductor memory devices including three-dimensionally arranged memory cells have been proposed for achieving a higher degree of integration.

A three-dimensional semiconductor memory device may include interlayer insulating layers and word lines stacked alternately with each other, and channel layers formed in channel holes passing therethrough. Memory cells may be stacked along the channel layers. Each of the channel layers may be coupled between a bit line and a source layer.

However, when a three-dimensional semiconductor memory device having a vertical stacked structure is manufactured, a misalignment may occur between a channel layer and a bit line resulting in a bit line leakage current, which may cause an operational failure of the semiconductor memory device.

SUMMARY

Various embodiments are directed to a semiconductor memory device with improved operational reliability.

According to an embodiment, a semiconductor memory device may include a cell array region formed on a substrate, a word line contact region, and a page buffer region coupled to the cell array region through bit lines, wherein at least one of the bit lines has a curved structure toward the word line contact region.

According to an embodiment, a semiconductor memory device may include a cell array region formed on a substrate, a word line contact region extending from word lines stacked on the cell array region, and a page buffer region coupled to the cell array region through bit lines, wherein the cell array region includes first contact plugs coupling the bit lines to cell plugs in the cell array region, wherein the page buffer region includes second contact plugs coupling the bit lines to transistors in the page buffer region, and wherein at least one of the first contact plugs is shifted to the word line contact region with respect to the second contact plugs.

According to an embodiment, a semiconductor memory device may include cell plugs extending from a substrate, conductive layers surrounding the cell plugs, stacked on the substrate and extending in a first direction, and bit lines coupled to the cell plugs and extending in a second direction crossing the first direction, wherein at least one of the bit lines has a curved structure in the first direction.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
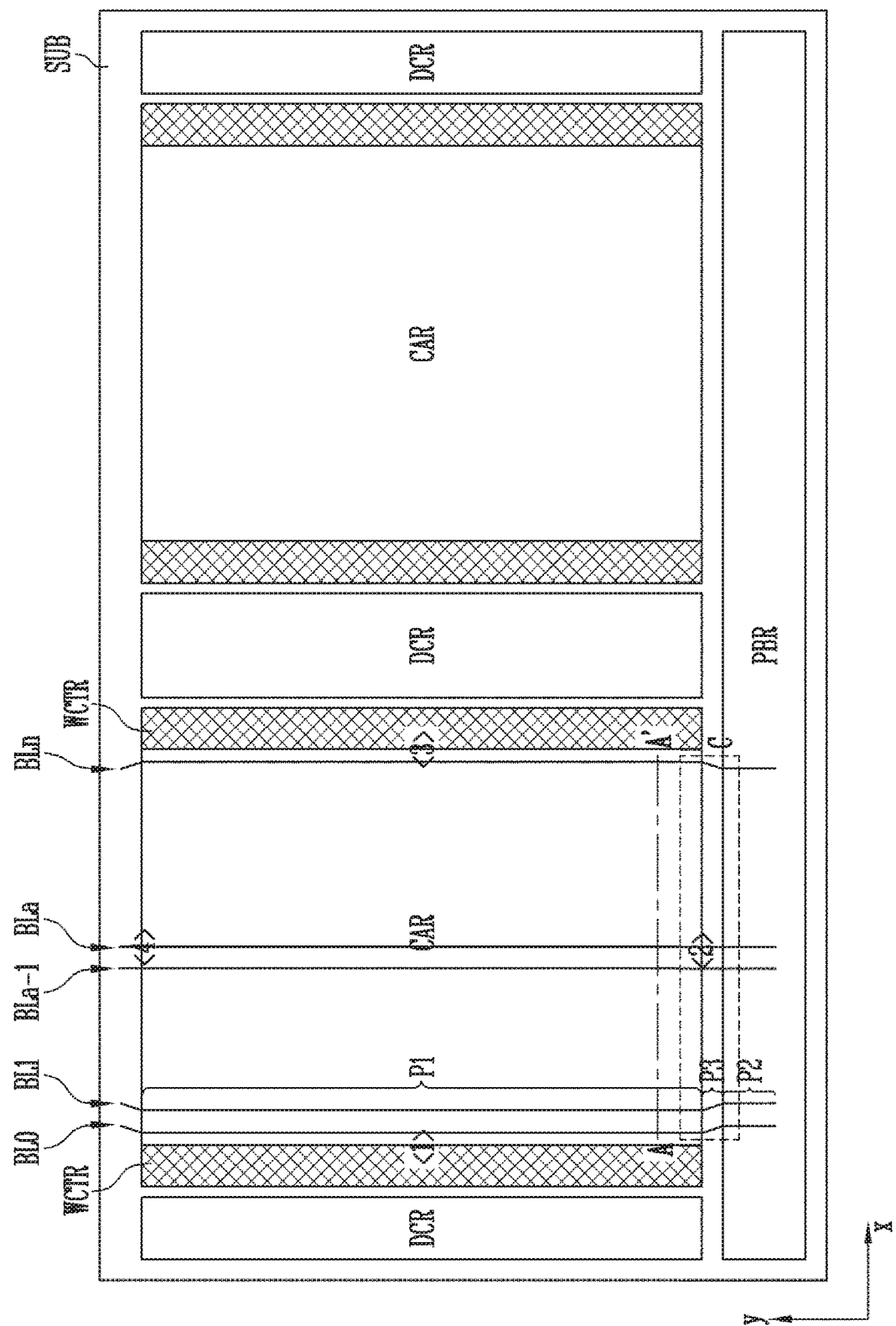
FIG. 1 is a diagram illustrating a semiconductor memory device according to an embodiment of the present invention.

Hereinafter, various exemplary embodiments will be described in detail with reference to the accompanying drawings. In the drawings, the thicknesses and the intervals of elements are exaggerated for convenience of illustration, and may be exaggerated compared to an actual physical thickness. In describing the present invention, well-known features which are peripheral to the principal point of the present invention may be omitted. It should also be noted that in giving reference numerals to elements of each drawing, like reference numerals may refer to like elements shown in different drawings.

FIG. 1 is a diagram illustrating a semiconductor memory device according to an embodiment.

Referring to FIG. 1, a semiconductor memory device may include a cell array region CAR, a word line contact region WCTR, a decoding circuit region DCR, and a page buffer region PBR.

A cell array may be located in the cell array region CAR, and memory cells for storing data may be formed therein. In an embodiment, each of the strings may be formed in a U shape. For example, strings in each of which at least one source selection transistor, a plurality of source side memory cells, at least one pipe transistor, a plurality of drain side memory cells and at least one drain selection transistor are coupled in series may be arranged in the cell array region CAR. In another embodiment, each of the strings may be a straight type string along a channel layer extending from a surface of a substrate SUB. For example, strings in each of which at least one source selection transistor, a plurality of memory cells and at least one drain selection transistor are coupled in series may be arranged in the cell array region CAR.

Word lines, selection lines (e.g., drain selection lines and source selection lines) and bit lines may be arranged in the cell array region CAR. Each of the word lines and the bit lines may be electrically coupled to a plurality of memory cells. For example, each word line may be coupled to a plurality of memory cells forming a page of memory cells. Each bit line may be coupled to a corresponding string of memory cells. In FIG. 1, the bit lines are denoted by reference characters BL0 to BLn.

The word line contact region WCTR may extend from the word lines stacked in the cell array region CAR so as to individually drive the stacked memory cells. The word line contact region WCTR may be coupled to word line contact plugs. The word line contact region WCTR may be formed in a stepwise stacked structure to be described later. Though not shown in FIG. 1, the semiconductor memory device may further include a selection line contact region extending from the selection lines formed in the cell array region CAR.

For example, when four surfaces <1> to <4> are defined in a counterclockwise direction on the basis of the cell array region CAR, the word line contact region WCTR may be formed to face at least one of the first and third surfaces <1> and <3> opposite to each other. For example, as shown in FIG. 1, the word line contact region WCTR may be defined on each of the first surface <1> and the third surface <3>. However, in another example, as shown in FIG. 2, the word line contact region WCTR may be formed on only the first surface <1>.

When a string is arranged in a U shape, a word line contact region may be generally defined on two surfaces of a cell array region. When a string is arranged in a straight structure, the word line contact region may be generally defined on one surface of the cell array region. Thus, FIG. 1 illustrates an embodiment employing a U-shaped string, whereas FIG. 2 illustrates an embodiment employing a straight type string. However, we note that the present invention is not limited only to U-shaped and straight type strings.

Figure 2:
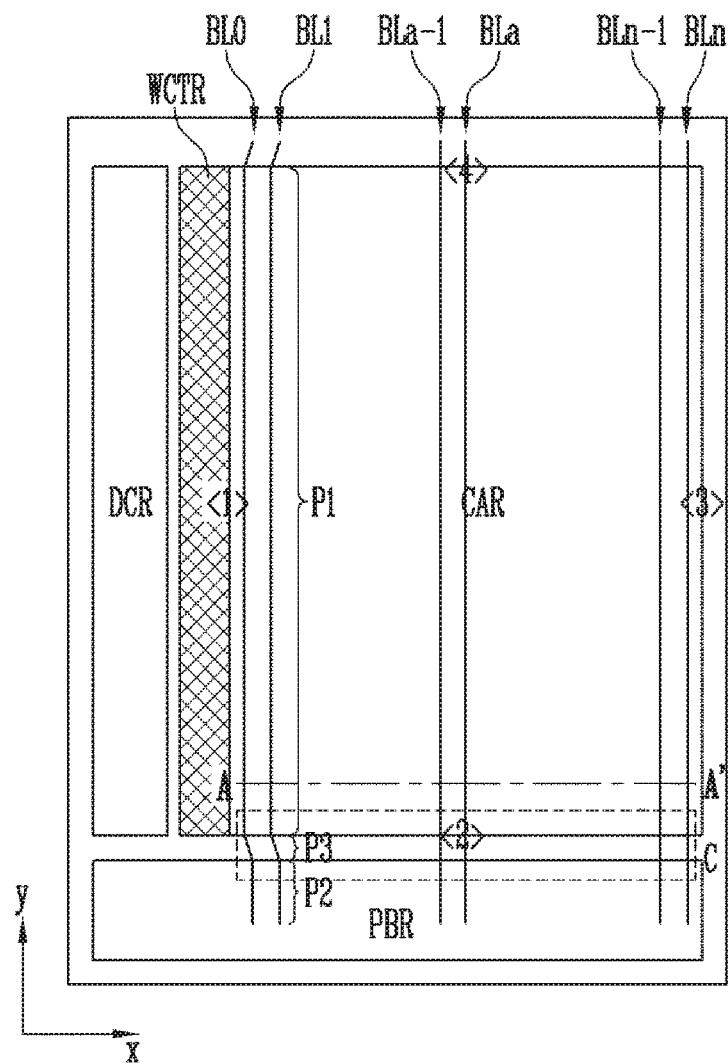
FIG. 2 is a diagram illustrating a semiconductor memory device according to another embodiment of the present invention.

Referring to FIGS. 1 and 2, the word line contact region WCTR may be arranged between the cell array region CAR and the decoding circuit region DCR. A wiring structure electrically coupling the word lines to driving transistors of the decoding circuit region DCR may be arranged in the word line contact region WCTR. The wiring structure may include word line contact plugs.

The word lines may extend from the cell array region CAR to the word line contact region WCTR. To facilitate electrical connections between the stacked word lines and the word line contact plugs, the word lines may have a stepwise structure in the word line contact region WCTR.

The driving transistors which are formed in the decoding circuit region DCR may be coupled to corresponding memory strings of the cell array region CAR through the selection lines and the word lines for transferring operating voltages to the memory strings. For example, the decoding circuit region DCR may include a row decoder. The row decoder may include a plurality of pass transistors controlling whether or not to apply the operating voltages to the selection lines and the word lines.

The page buffer region PBR may be coupled to the bit lines BL0 to BLn of the cell array region CAR, may transmit and receive data to and from the cell array region CAR, and may temporarily store transferred data. The page buffer region PBR may include a precharge circuit, a bit line selection transistor, a sensing circuit and an input/output circuit.

Though not shown in FIGS. 1 and 2, the semiconductor memory device may include a word line driver, a sense amplifier, and a control circuit as a peripheral circuit configured to drive the memory cells and read data stored in the memory cells.

As shown in FIGS. 1 and 2, at least one of the bit lines BL0 to BLn coupling the page buffer region PBR to the cell array region CAR may have an outwardly curved structure. Curvedness of the at least one curved bit line of the bit lines BL0 to BLn may increase toward the decoding circuit region DCR. In other words, the curvedness of the at least one curved bit line of the bit lines BL0 to BLn may increase toward the word line contact region WCTR.

When the word line contact region is defined at both sides of the cell array region as shown in FIG. 1, the curvedness of the bit lines may increase from the center toward both edges of the cell array region. In other words, when the word line contact region is defined at both sides of the cell array region as shown in FIG. 1, the curvedness of the bit lines may increase in both directions.

According to another embodiment, when the word line contact region WCTR is formed at only one side of the cell array region as shown in FIG. 2, the curvedness of the bit lines may increase from the center toward only the one edge where the word line contact region WCTR is formed. In other words, when the word line contact region WCTR is formed at only one side of the cell array region as shown in FIG. 2, the curvedness of the bit lines may increase in a single direction.

For describing a bit line curved structure in more detail, the bit lines may be divided into three portions. Each of the bit lines BL0 to BLn extending over the cell array region CAR and the page buffer region PBR may be divided into a first portion P1 placed on the cell array region CAR, a second portion P2 placed on the page buffer region PBR, and a third portion P3 placed between the cell array region CAR and the page buffer region PBR with the third portion P3 coupling the first portion P1 and the second portion P2 to each other.

Slopes of the third portions P3 of the respective bit lines may increase in a direction from the third portion of a central bit line BLa which is located over the center of the cell array region CAR toward the third portion of edge bit lines BL0 or BLn which are located over the edges of the cell array region CAR. Hereinafter, a slope of the third portion P3 of a bit line may refer to the angle formed between the P3 portion of the bit line and the y-axis as shown in FIGS. 1 and 2. As illustrated in FIGS. 1 and 2 the portions P1 and P2 of a bit line generally extend along the Y direction.

The slopes of the third portions P3 of the bit lines BL0 to BLn increase from the central bit line toward an edge bit line hence, the third portions P3 of the two or more bit lines may have different orientations which are offset at different angles form the Y-axis direction. On the other hand, the first portions P1 of the bit lines and the second portions P2 may have substantially the same orientation, e.g., extending along the Y-axis direction. The third portions P3 of one or more bit lines may have the slopes as shown in FIGS. 1 and 2 and FIGS. 3 and 4 to be described below. However, the invention is not limited thereto. For example, in an embodiment, the portions P1 and P2 of the bit lines may also be partially inclined from the Y-direction, particularly, the boundaries between the third portions P3 and neighboring parts of the first and second portions P1 and P2, allowing for smoother transition.

According to an embodiment, when the word line contact region is defined at both sides of the cell array region, i.e., on the first surface <1> and the third surface <3>, the curvedness of the bit lines may increase in both directions toward the first surface and the third surface. According to another embodiment, when the word line contact region is defined at one side of the cell array region, i.e., only on the first surface <1>, the curvedness of the bit lines may increase in one direction toward the first surface <1>.

The semiconductor memory device having the curved bit line structure as described above may substantially reduce or eliminate a misalignment between the cell plug and the contact plug caused by a cell plug bending phenomenon, so that operational reliability of the semiconductor memory device may be improved.

Hereinafter, the structure of the semiconductor memory device having the curved bit line structure is described in more detail with reference to FIGS. 3 to 15.

Figure 3:
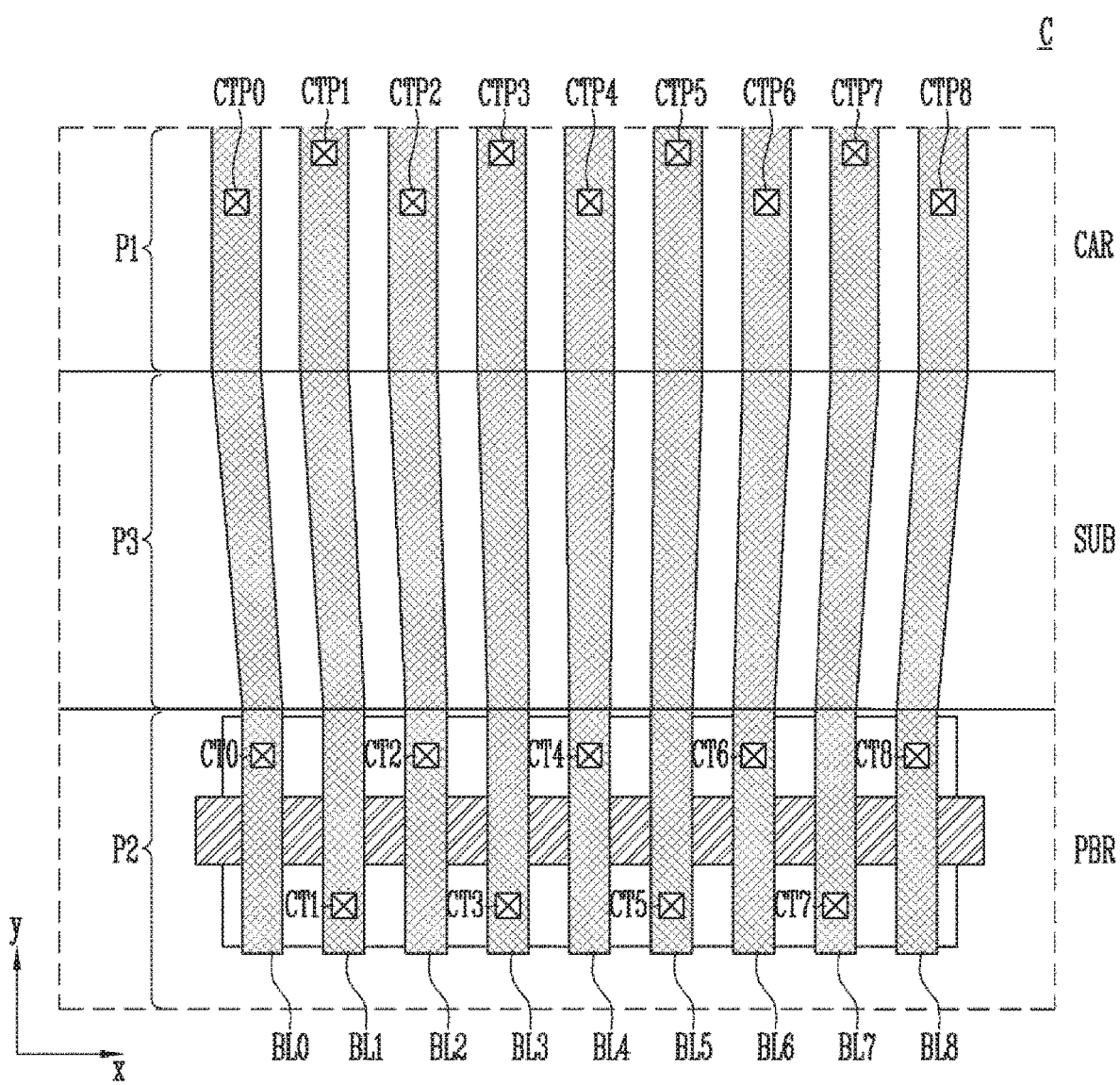
FIG. 3 is a layout view of a portion C of FIG.
Figure 4:
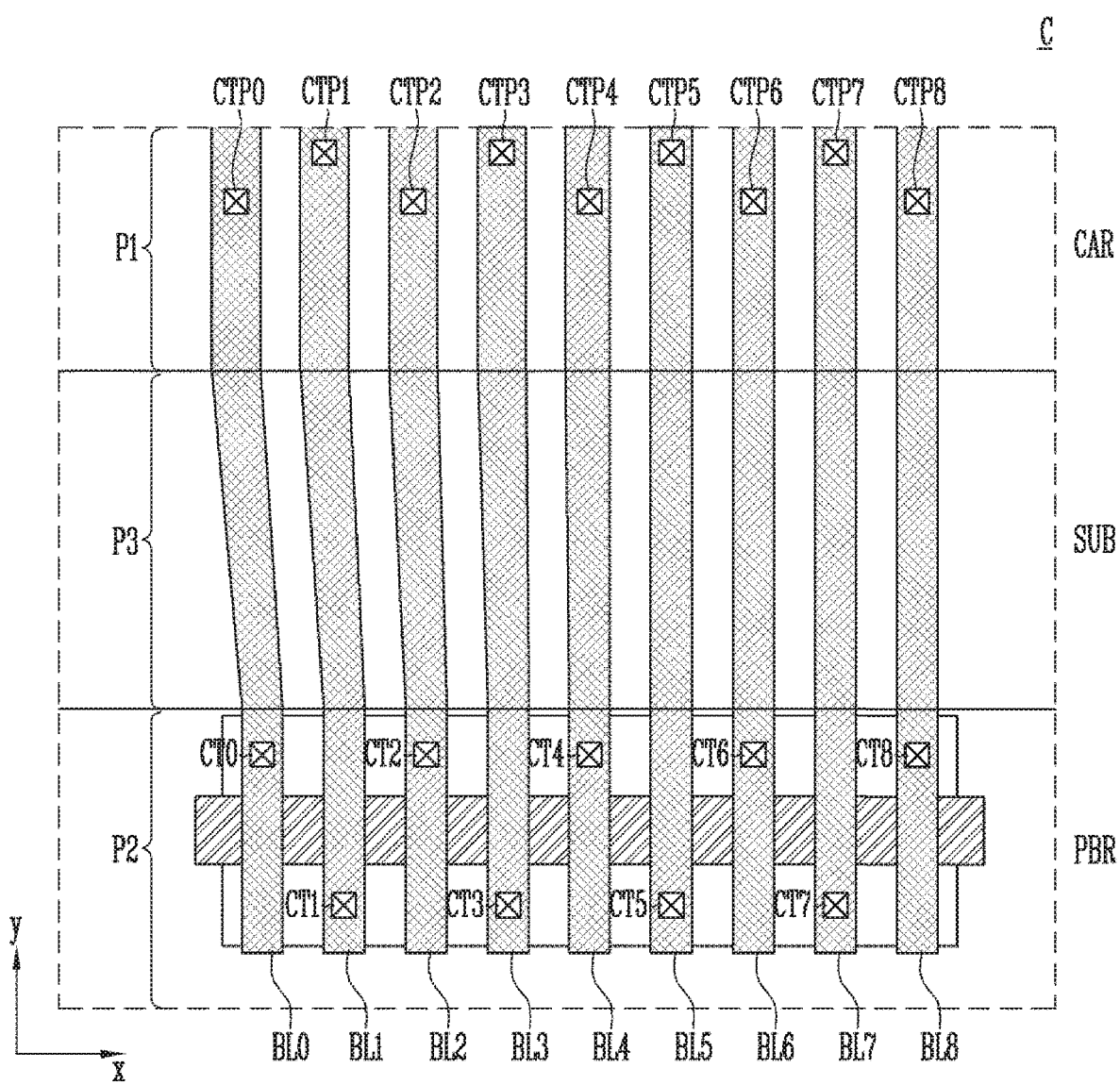
FIG. 4 is a layout view of a portion C of FIG. 2.

FIG. 3 is a layout view of a portion C (FIG. 1) of the semiconductor memory device according to an embodiment. FIG. 4 is a layout view of a portion C (FIG. 2) of the semiconductor memory device according to another embodiment. Hereinafter, for convenience of explanation, it is assumed that a total of nine bit lines BL0 to BLn (i.e., n=8) are located over one cell array region CAR. However, the invention is not limited thereto.

Referring to FIGS. 3 and 4, the page buffer region PBR and the cell array region CAR may be coupled to each other through the bit lines BL0 to BL8. The bit lines BL0 to BL8 may extend over the cell array region CAR and the page buffer region PBR. The bit lines BL0 to BL8 may extend over the cell array region CAR and the page buffer region PBR in a generally y-axis direction.

Figure 5:
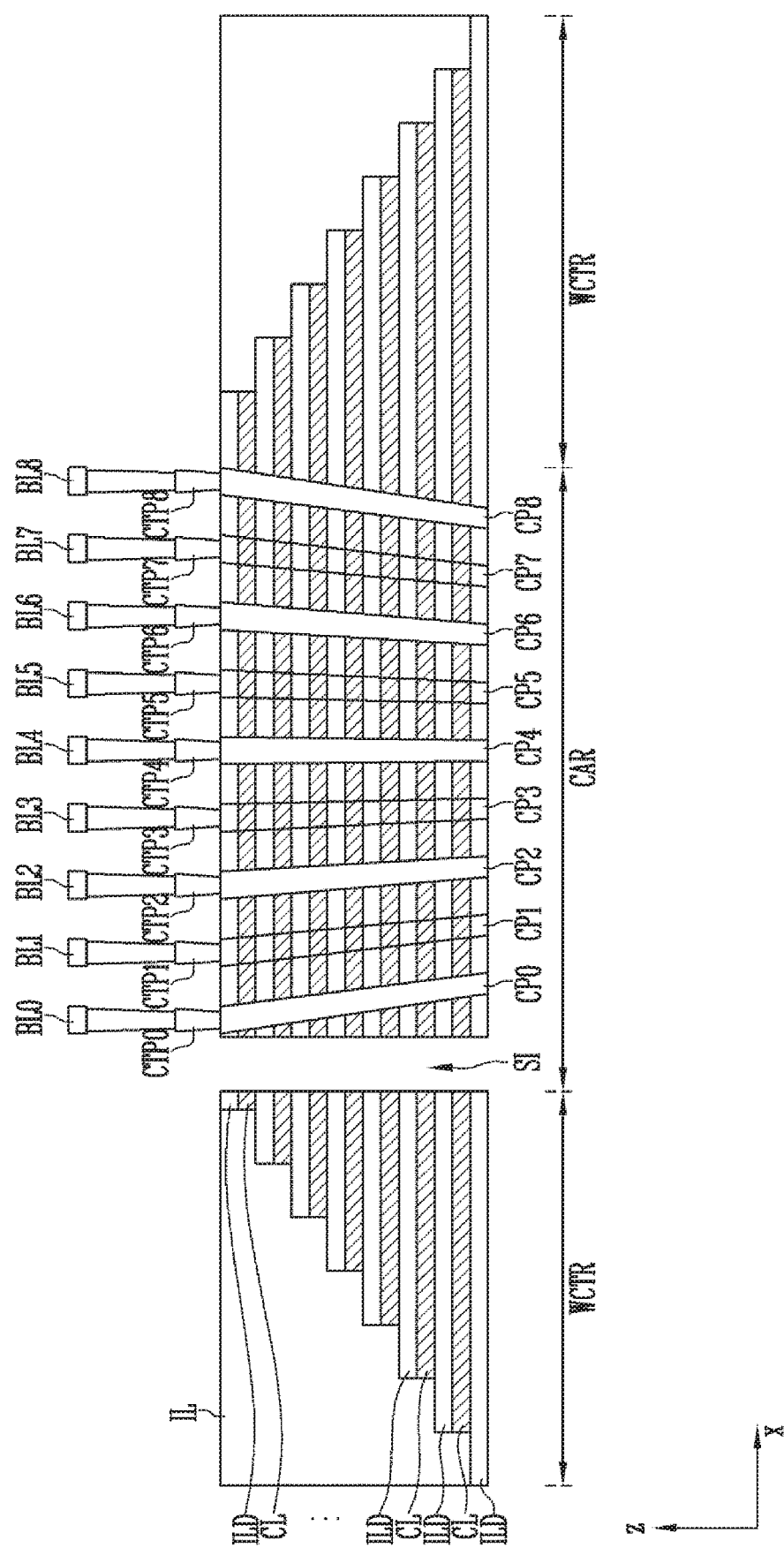
FIG. 5 is a cross-sectional view taken along line A-A' of FIG.
Figure 6:
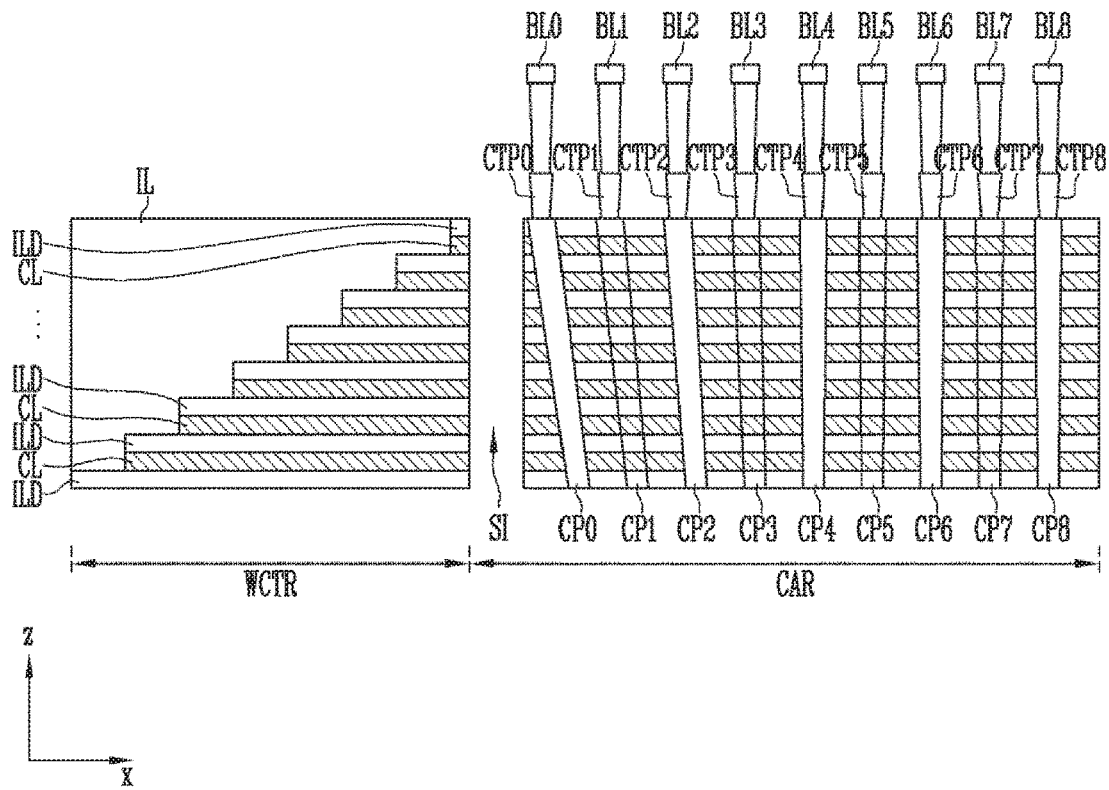
FIG. 6 is a cross-sectional view taken along line A-A' of FIG. 2.

Contact plugs CTP0 to CTP8 coupling the bit lines BL0 to BL8 to cell plugs CP0 to CP8 as shown in FIGS. 5 and 6 to be described below may be arranged in the cell array region CAR. Contact plugs CT0 to CT8 coupling the bit lines BL0 to BL8 to transistors forming a page buffer circuit of the page buffer region PBR may be arranged over the page buffer region PBR.

The first portion P1 of each of the bit lines BL0 to BL8 may be located in the cell array region CAR, the second portion P2 thereof may be located in the page buffer region PBR, and the third portion P3 thereof may be located in the substrate SUB between the cell array region CAR and the page buffer region PBR.

The slopes of the third portions P3 of the bit lines BL0 to BL8 may increase from the center to the edge. When a word line contact region is defined at both sides of the cell array region, the slopes of the third portions P3 may increase in both directions (see FIG. 3). When the word line contact region is defined at one side of the cell array region, the slopes of the third portions P3 may increase in one direction (see FIG. 4).

More specifically, the bidirectional increase in the slopes of the P3 portions of the bit lines will be first described with reference to FIG. 3. For example, when the fifth bit line BL4 is the central bit line located over the center of the cell array region CAR, the third portion P3 of the bit line BL3 adjacent to the left of the fifth bit line BL4 may have a greater slope than that of the bit line BL4, the third portion P3 of the bit line BL2 adjacent to the left of the bit line BL3 may have a greater slope than that of the bit line BL3, the third portion P3 of the bit line BL1 adjacent of the left of the bit line BL2 may have a greater slope than that of the bit line BL2, and the third portion P3 of the bit line BL0 adjacent to the left of the bit line BL1 may have a greater slope than that of the bit line BL1. As described above, the slopes of the third portions P3 of the bit lines BL0 to BL8 increase from the center to the left edge.

In the same manner, the slopes of the third portions P3 of the bit lines BL5, BL6, BL7 and BL8 may increase from the center to the right edge. In other words, when the bit line BL4 is located at the center of the cell array region CAR, the third portion P3 of the bit line BL5 adjacent to the right of the bit line BL4 may have a greater slope than that of the bit line BL4, the third portion P3 of the bit line BL6 adjacent to the right of the bit line BL5 may have a greater slope than that of the bit line BL5, the third portion P3 of the bit line BL7 adjacent to the right of the bit line BL6 may have a greater slope than that of the bit line BL6, and the third portion P3 of the bit line BL8 adjacent to the right of the bit line BL7 may have a greater than that of the bit line BL7.

Changes in the slopes on the basis of the central bit line BL4 located over the center are described with reference to FIG. 3. However, the invention is not limited thereto. In consideration of a cell plug bending phenomenon to be described below, slopes of third portions may increase toward both edges on the basis of the bit lines BL3 to BL5, or the bit lines BL2 to BL6. However, in either case, the slopes of the third portions may increase toward both edges.

Referring to FIG. 4, a unidirectional increase in the slopes of the P3 portions of the bit lines is illustrated. Accordingly, the fifth bit line BL4 is the central bit line located over the center of the cell array region CAR. The third portion P3 of the bit line BL3 adjacent to the left of the bit line BL4 may have a greater slope than that of the bit line BL4, the third portion P3 of the bit line BL2 adjacent to the left of the bit line BL3 may have a greater slope than that of the bit line BL3, the third portion P3 of the bit line BL1 adjacent to the left of the bit line BL2 may have a greater slope than that of the bit line BL2, and the third portion P3 of the bit line BL0 adjacent to the left of the bit line BL1 may have a greater slope than that of the bit line BL1. As described above, the slopes of the third portions P3 of the bit lines BL0 to BL8 may increase from the center to the left edge.

However, contrary to the bidirectional case as shown in FIG. 3, the slopes of the third portions of the bit lines BL5 to BL8 adjacent to the right of the bit line BL4 may not change. In FIG. 4, a description is made about the changes in the slopes on the basis of the bit line BL4 located at the center. However, the invention is not limited thereto. In consideration of a cell plug bending phenomenon to be described below, the slopes of the third portions may increase toward the left edge on the basis of the bit line BL3 or the bit line BL5. However, in either case, according to the embodiment of FIG. 4, the slopes of the third portions may increase only toward one edge.

The curved structure is described above when each of the bit lines has a different shape from its neighboring bit line. In an embodiment, a curved structure may also be provided in units of bit line groups. In other words, the slopes of the third portions may be increased in units of bit line groups, each of which includes at least two bit lines, and thus the curved structure may also be provided when each bit line group has a different shape from its neighboring bit line group.

For example, referring to the embodiment in which slopes of third portions increase in both directions as shown in FIG. 3, the third portions P3 of the first bit line group including the bit lines BL0 and BL1 may have greater slopes than those of the second bit line group including the bit lines BL2 and BL3, and the third portions P3 of the second bit line group may have greater slopes than that of the third bit line group including the bit line BL4.

In the same manner, the third portions P3 of the fourth bit line group including the bit lines BL5 and BL6 may have greater slopes than those of the third bit line group, and the third portions P3 of the fifth bit line group including the bit lines BL7 and BL8 may have greater slopes than those of the fourth bit line group.

The third portions of the bit lines included in the same group may have the same slope. Since a semiconductor memory device may include hundreds to thousands of bit lines, forming a curved structure in units of groups each including two or more bit lines may be advantageous in terms of simplifying manufacturing processes. The same technical concept of changing the slopes of the P3 portions of the bit lines in units of groups, rather than individually, may also be applied to the embodiment of FIG. 4, where the bit lines have slopes increasing in a single direction.

As described above, the slopes of the third portions P3 of the bit lines arranged between the page buffer region PBR and the cell array region CAR may increase toward the word line contact region WCTR, so that the bit lines may have a curved structure.

Hereinafter, a vertical connection structure between the bit lines having the above-described curved structure and the cell plugs will be described.

FIG. 5 is a cross-sectional view taken along line A-A' of FIG. 1. FIG. 6 is a cross-sectional view taken along line A-A of FIG. 2.

Referring to FIGS. 5 and 6, the cell plugs CP0 to CP8 may be formed in the cell array region CAR. The cell plugs CP0 to CP8 may extend from the substrate SUB as shown in FIGS. and 2 upwards through insulating layers ILD and conductive layers CL. Each of the cell plugs CP0 to CP8 may include a channel layer and a memory layer surrounding the channel layer. The memory layer may be formed in a channel hole passing through the insulating layers and the conductive layers. The memory layer may have a multilayer structure including a blocking insulating layer, a data storage layer, and a tunnel insulating layer. For example, the memory layer may have a multilayer structure of oxide layer/nitride layer/oxide layer. As shown in FIGS. 5 and 6, one cell plug and one contact plug are illustrated to be coupled to one bit line. However, it should be understood, that a plurality of cell plugs spaced apart at a regular interval along a bit line (e.g., the Y axis direction) may be coupled to one bit line. Also, it should be understood that a plurality of contact plugs which are spaced apart at a regular interval along a bit line may be coupled to one bit line. For convenience of explanation, in FIGS. 5 and 6, it is assumed that a total of nine bit lines BL0 to BL8 (i.e., n=8) are spaced apart at a regular interval along the x-axis direction over one cell array region CAR and that nine corresponding nine cell plugs CP0 to CP8 are spaced apart in a row along the X axis direction and are coupled via nine corresponding contact plugs CTP0 to CTP8 to the bit lines. However, the invention is not limited thereto, and in an actual semiconductor device the number of bit lines and corresponding cell plugs and contact plugs that can be arranged and the X axis direction in a single row may vary per.

The cell plugs CP0 to CP8 may be bent due to various types of stress caused during manufacturing processes of a semiconductor memory device. For example, manufacturing processes of a semiconductor memory device may include a process of forming a stacked structure including the insulating layers ILD and the sacrificial layers, a process of forming the cell plugs CP0 to CP8 passing through the stacked structure, a process of patterning the stacked structure in a stepwise manner, a process of forming an insulating layer IL covering the stepwise stacked structure, a process of forming a slit SI passing through the stacked structure, a process of forming openings by removing sacrificial layers through the slit SI, and filling openings with the conductive layers CL.

A tensile/compressive force may be applied between the insulating layer IL covering the stepwise stacked structure and the insulating layers ILD forming the stepwise stacked structure. Therefore, the cell plugs CP0 to CP8 may be bent toward the word line contact region WCTR. The force may increase as more insulating layers ILD are stacked to form the stacked structure. In particular, the force may increase toward the word line contact region WCTR. In other words, a portion closer to the word line contact region WCTR may be subjected to a greater force than a portion further away from the word line contact region WCTR.

Therefore, when the word line contact region WCTR is defined at both sides of the cell array region, the cell plugs CP0 to CP8 may be bidirectionally bent at both edges of the cell array region CAR which are close to the word line contact region WCTR as shown in FIG. 5. In other words, the cell plugs may be most bent at both edges of the cell array region CAR adjacent to the word line contact region WCTR, and the cell plugs may be less bent toward to center of the cell array region CAR.

In another example, when the word line contact region is defined at one side of the cell array region, the cell plugs CP0 to CP8 may be bent unidirectionally at one edge of the cell array region CAR close to the word line contact region WCTR as shown in FIG. 6. In other words, the cell plugs may be most bent at one edge of the cell array region CAR adjacent to the word line contact region WCTR, and the cell plugs may be less bent toward the center of the cell array region CAR, i.e., away from the word line contact region WCTR.

In consideration of the bending tendency of the cell plugs CP0 to CP8, the contact plugs CTP0 to CTP8 and the bit lines BL0 to BL8 may be shifted from the center of the cell array region CAR toward the edge, i.e., toward the word line contact region WCTR. Accordingly, when the cell plugs are bent, a misalignment may be avoided by contact plugs and bit lines designed in consideration of a bending phenomenon according to an embodiment. The bending phenomenon may also occur in the contact plugs CTP0 to CTP8, and a misalignment may be avoided by bit lines designed in consideration of a bending phenomenon. The above-described tensile/compressive force may be involved in the bending phenomenon of the contact plugs. When a total height of a contact plug is designed to be high, the height of the contact plug may also be involved in a bending phenomenon of contact plugs. Alternatively, a step which may be involved during a process of planarizing the insulating layers ILD by a CMP process may be involved in the bending phenomenon of the contact plugs.

Hereinafter, a shifted structure of the contact plugs will be described in more detail with reference to FIGS. 5 and 6.

According to an embodiment, at least one of the contact plugs CTP0 to CTP8 may be shifted from the original positions in consideration of the above-described bending tendency of the cell plugs CP0 to CP8. Therefore, the bottom surface of each of the contact plugs CTP0 to CTP8 may be aligned with the top surface of a corresponding cell plug among the cell plugs CP0 to CP8.

According to an embodiment, referring to FIG. 5 showing that a bidirectional bending phenomenon occurs, a distance by which the contact plugs CTP0 and CTP8 located at the outermost edges (i.e., located closest to the stepwise stacked structure) is shifted may correspond to the bending level of the cell plugs CP0 and CP8 located at the outermost edges (i.e., located closest to the stepwise stacked structure). For example, when the contact plugs CP0 and CP8 have higher bending levels, the contact plugs CTP0 and CTP8 may be shifted from the original positions by greater distances.

The cell plugs CP0 to CP8 may be bent symmetrically with respect to the cell plug CP4 located at the center of the cell array region CAR since the word line contact region WCTR having the stepwise stacked structure is formed at both sides of the cell array region CAR, i.e., the first surface <1> and the third surface <3> as described above with reference to FIG. 1.

Since the influence of the above-described compressive/tensile force wears off toward the center of the cell array region CAR from the word line contact region WCTR, the bending phenomenon of the cell plugs may be reduced near the center. Therefore, for example, the contact plug CTP4 located at the center of the cell array region CAR may not be shifted. In other words, the contact plugs CTP0 and CTP8 located at both edges may be shifted by the largest distances. The distance by which each of the contact plugs is shifted may gradually decrease in a direction moving away from the word line contact region towards the center. Thus, the contact plug CTP4 located at the center may not be shifted. It is described above that the contact plug CTP4 located at the center is not shifted since the influence of the compressive/tensile force is reduced. However, the invention is not limited thereto. In consideration of the bending tendency of the cell plugs, shifting may not occur starting from the contact plugs CTP3 and CTP5 (i.e., the contact plugs CTP3 to CTP5 may not be shifted) when the bending levels of the cell plugs are low. When the bending levels of the cell plugs are lower, shifting may not occur starting from the contact plugs CTP2 and CTP6 (i.e., the contact plugs CTP2 to CTP6 may not be shifted). In either case, the distance by which each of the contact plugs is shifted may decrease away from the word line contact region WCTR.

The bending levels of the cell plugs CP0 to CP8 may be measured based on the difference in position of upper portions of the cell plugs with respect to lower portions thereof.

According to another embodiment, referring to FIG. 6 showing the occurrence of a unidirectional bending phenomenon, the distance by which the contact plug CTP0 located at the outermost edge (i.e., located closest to the stepwise stacked structure) is shifted may correspond to the bending level of the cell plug CP0 located at the outermost edge (i.e., located closest to the stepwise stacked structure). For example, when the cell plug CP0 has a high bending level, the contact plug CTP0 may be shifted from the original position by a greater distance.

Contrary to the bidirectional bending phenomenon as shown in FIG. 5, the bending tendency of the cell plugs CP0 to CP8 may have a vertically asymmetric structure since the word line contact region WCTR where the stepwise stacked structure is formed is defined at only one side of the cell array region CAR, i.e., only on the first surface <1>.

Since the above-described compressive/tensile force wears off toward the center of the cell array region CAR away from the word line contact region WCTR, the bending phenomenon of the cell plugs may be reduced. Therefore, for example, shifting may not occur starting from the contact plug CTP4 located at the center of the cell array region CAR. In other words, the contact plug CTP0 located at one edge may be shifted by the largest distance. The distance by which each of the contact plugs is shifted may decrease away from the word line contact region. Thus, shifting may not occur starting from the contact plug CTP4 located at the center. It is described above that shifting does not occur starting from the contact plug CTP4 located at the center due to the decrease in the influence of the compressive/tensile force. However, the invention is not limited thereto. In consideration of the bending tendency of the cell plugs, shifting may not occur starting from the contact plug CTP3 (i.e., the contact plugs CTP3 to CTP8 may not be shifted) when the cell plugs have lower bending levels. When the bending level is lower, shifting may not occur starting from the contact plug CTP2 (i.e., the contact plugs CTP2 to CTP8 may not be shifted). On the other hand, shifting may not occur starting from the contact plug CTP5 (i.e., the contact plugs CTP5 to CTP8 may not be shifted). When the bending level is higher, shifting may not occur starting from the contact plug CTP6 (i.e., the contact plugs CTP6 to CTP8 may not be shifted). In either case, the distance by which the contact plugs are shifted may decrease away from the word line contact region WCTR.

Hereinafter, the shifted structure of the bit lines will be described with reference to FIGS. 5 and 6 again.

According to an embodiment, the first portions P1 (FIGS. 1 to 4) of one or more of the bit lines BL0 to BL8 may be shifted from the original portion.

According to an embodiment, referring to FIG. showing that a bilateral bending phenomenon occurs, distances by which the first portions of the bit lines BL0 and BL8 located at the outermost edge (i.e., located closest to the stepwise stacked structure) are shifted may correspond to bending levels of the cell plugs CP0 and CP8 located at the outermost edge (i.e., located closest to the stepwise stacked structure). For example, when the cell plugs CP0 and CP8 have higher bending levels, the first portions of the bit lines BL0 and BL8 may be shifted from the original positions by larger distances.

Since the influence of the above-described compressive/tensile force wears off toward the center of the cell array region CAR away from the word line contact region WCTR, a bending phenomenon of the cell plugs may be reduced. Therefore, for example, the first portion of the bit line BL4 located at the center of the cell array region may not be shifted. In other words, the first portions of the bit lines BL0 and BL8 located at both edges may be shifted by the largest distances. The distance by which the bit line is shifted may decrease away from the word line contact region. Thus, the first portion of the bit line BL4 located at the center may not be shifted. It is described above that the first portion of the bit line BL4 located at the center is not shifted due to the decrease in influence of the compressive/tensile force. However, the invention is not limited thereto. When the bending levels of the cell plugs are low, shifting may not occur starting from the first portions of the bit lines BL3 and BL5 (i.e., the first portions of the bit line BL3 to BL5 may not be shifted). When the bending levels are lower, shifting may not occur starting from the first portions of the bit lines BL2 and BL6 (i.e., the first portions of the bit lines BL2 to BL6 may not be shifted). In either case, the distance by which each of the first portions of the bit lines is shifted may decrease from the word line contact region WCTR.

Referring to FIG. 6 where a unidirectional bending phenomenon occurs, the distance by which the first portion of the bit line BL0 located at the outermost edge (i.e., located closest to the stepwise stacked structure) is shifted may correspond to the bending level of the cell plug CP0 located at the outermost edge (i.e., located closest to the stepwise stacked structure). For example, when the cell plug CP0 has a high bending level, the first portion of the bit line BL0 may be shifted from the original position by a high distance.

Since the influence of the above-described compressive/tensile force wears off toward the center of the cell array region CAR away from the word line contact region WCTR, the bending phenomenon of the cell plugs may be reduced. Therefore, the first portion of the bit line BL4 located at the center of the cell array region CAR may not be shifted. In other words, the first portion of the bit line BL0 located at one edge may be shifted by the largest distance. The distance by which each of the bit lines is shifted may decrease away from the word line contact region WCTR. Thus, shifting may not occur starting from the first portion of the bit line BL4.

It is described above that shifting may not occur starting from the first portion of the bit line BL4 located at the center of the cell array region CAR due to the decrease in influence of the compressive/tensile force. However, the invention is not limited thereto. When the bending levels of the cell plugs are low, shifting may not occur starting from the first portion of the bit line BL3 (i.e., the first portions of the bit lines BL3 to BL8 may not be shifted). When the bending levels are lower, shifting may not occur starting from the first portion of the bit line BL2 (i.e., the first portions of the bit lines BL2 to BL8 may not be shifted). Alternatively, when the cell plugs have higher bending levels, shifting may not occur from the first portion of the bit line BL5 (i.e., the first portions of the bit lines BL5 to BL8 may not be shifted). When the cell plugs have much higher bending levels, shifting may not occur starting from the first portion of the bit line BL5 (i.e., the first portions of the bit lines BL6 to BL8 may not be shifted). In either case, the distance by which each bit line is shifted may decrease away from the word line contact region.

Figure 7:
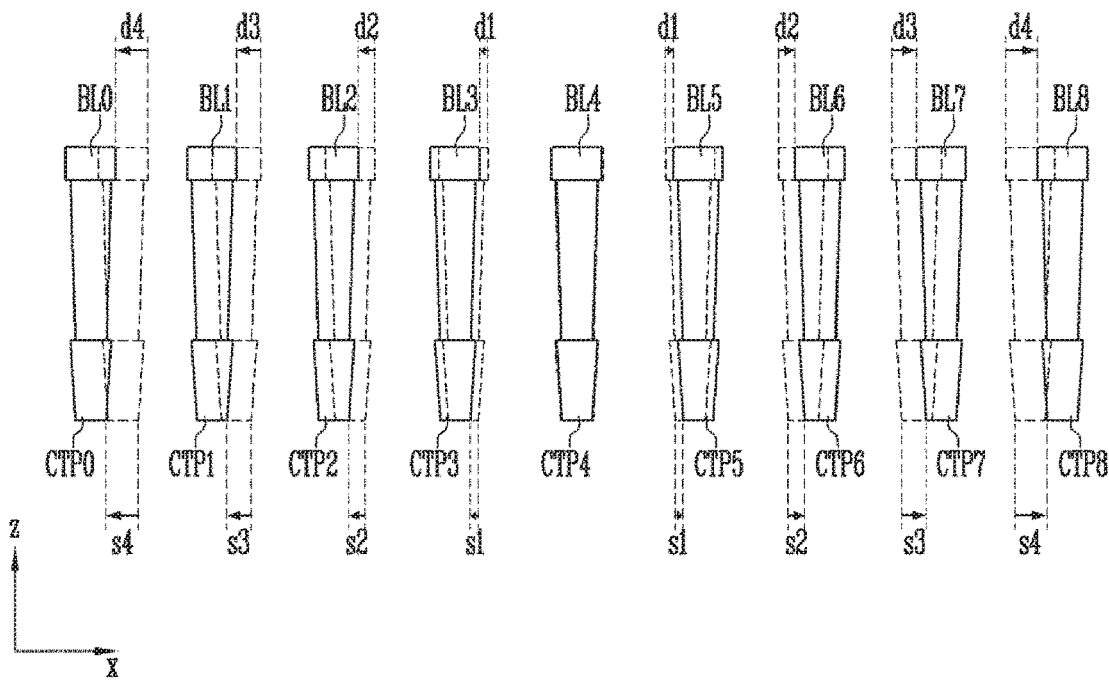
FIG. 7 is a view showing positions of contact plugs and bit lines according to an embodiment of the present invention and positions according to prior art designed without considering the bending tendency of cell plugs.
Figure 8:
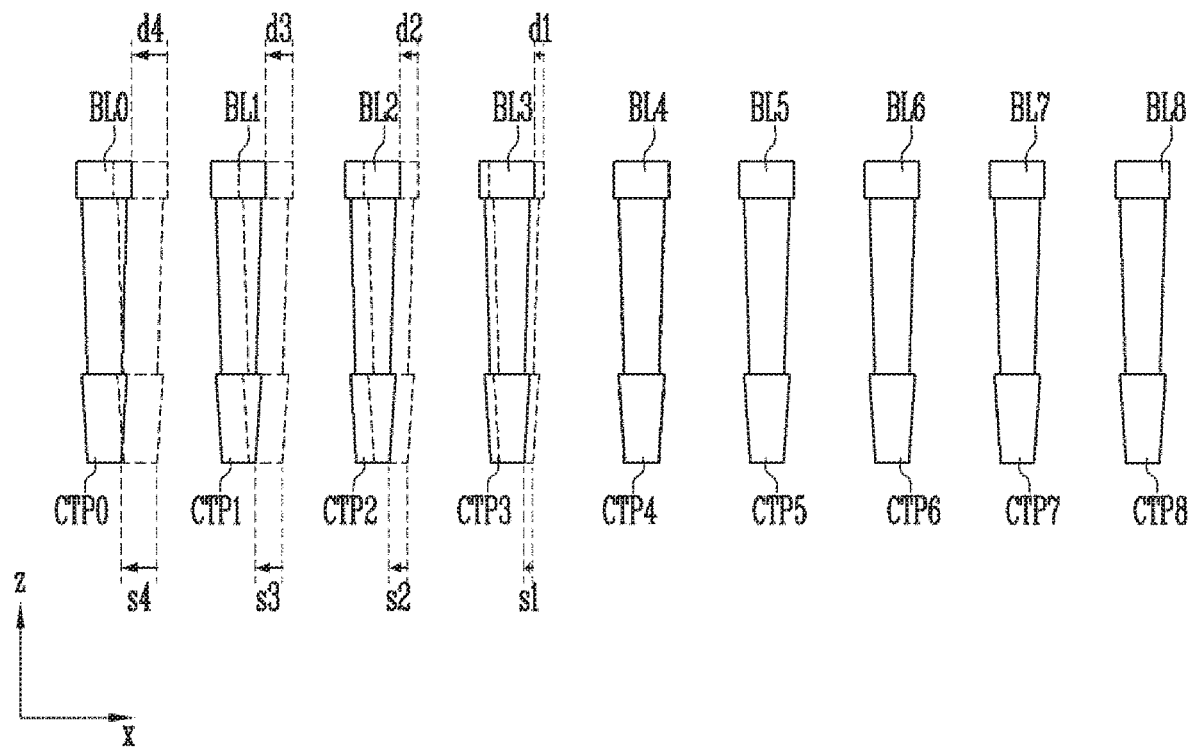
FIG. 8 is a view showing positions of contact plugs and bit lines according to another embodiment of the present invention and positions according to prior art designed without considering the bending tendency of cell plugs.

FIG. 7 is a view showing the positions of the contact plugs CTP0 to CTP8 and the bit lines BL0 to BL8 according to an embodiment and the conventional contact plugs and bit lines designed without considering the bending tendency of cell plugs. In addition, FIG. 8 is a view showing the positions of the contact plugs CTP0 to CTP8 and the bit lines BL0 to BL8 according to another embodiment and the conventional contact plugs and bit lines designed without considering the bending tendency of cell plugs. In FIGS. 7 and 8, the positions according to the embodiments are indicated by solid lines and the existing positions are indicated by dashed lines.

First, referring to FIG. 7 showing that the contact plugs and the bit lines are shifted in both directions, the contact plugs CTP0 to CTP8, except for the contact plug CTP4 located at the center, may be shifted from the original positions by distances d1, d2, d3, and d4 in order in which the contact plugs CTP0 to CTP3 and CTP5 to CTP8 are away from the contact plug CTP4 (i.e., the order in which the contact plugs CTP0 to CTP3 and CTP5 to CTP8 are close to the word line contact region). The relationship $d1<d2<d3<d4$ may be satisfied. In addition, the bit lines BL0 to BL8, except for the bit line BL4 located at the center, may be shifted from the original positions by distances s1, s2, s3, and s4 in order in which the bit lines BL0 to BL3 and BL5 to BL8 are away from the bit line BL4 (i.e., the order in which the bit lines CTP0 to CTP3 and CTP5 to CTP8 are close to the word line contact region). The relationship $s1<s2<s3<s4$ may be satisfied.

Referring to FIG. 8 showing that the contact plugs and the bit lines are shifted in one direction, the contact plugs CTP0 to CTP8, except for the contact plugs CTP4 to CTP8 ranging from the contact plug CTP4 located at the center to the contact plug CTP8 furthest away from the word line contact region may be shifted from the original positions by distances d1, d2, d3, and d4 in order in which the contact plugs CTP0 to CTP3 are away from the contact plug CTP4 (i.e., the order in which the contact plugs CTP0 to CTP3 are close to the word line contact region). The relationship $d1<d2<d3<d4$ may be satisfied. In addition, the bit lines BL0 to BL8, except for the bit lines BL4 to BL8 ranging from the bit line BL4 located at the center to the bit line BL8 furthest away from the word line contact region may be shifted from the original positions by distances s1, s2, s3, s4 in order in which the bit lines BL0 to BL3 are away from the bit line BL4 (i.e., the order in which the bit lines BL0 to BL3 are close to the word line contact region). The relationship $s1<s2<s3<s4$ may be satisfied.

It is described above that the contact plugs and the bit lines are shifted on the basis of the contact plug CTP4 and the bit line BL4 located at the center. However, as described above with reference to FIGS. 3 to 6, the invention is not limited thereto.

As described above, according to an embodiment, the contact plugs CTP0 to CTP8 and the bit lines BL0 to BL8 may be shifted in a direction toward the word line contact region WCTR where the stepwise stacked structure is formed in consideration of the bending tendency of the cell plugs CP0 to CP8 so as to prevent a misalignment due to changes in positions of the cell plugs CP0 to CP8 when the cell plugs CP0 to CP8 are bent. Therefore, according to an embodiment, a bit line leakage current may be prevented and thus the operational reliability of the semiconductor memory device may be substantially improved. In addition, according to an embodiment, the size of the semiconductor memory device may be reduced by reducing the number of existing dummy cell plugs provided to prevent malfunctioning due to misalignment.

Since the cell plugs CP0 to CP8 are located in the cell array region CAR, multilayer metal lines including the contact plugs and the bit lines may be shifted only in the cell array region CAR. The peripheral circuit region including the page buffer region PBR may maintain its existing layout without being subject to shifting as described above, so that changes in design may be minimized.

In addition, since the bit lines BL0 to BL8 extend over the cell array region CAR and the page buffer region PBR, portions corresponding to the cell array region CAR may be shifted and portions corresponding to the page buffer region PBR may not be shifted. Therefore, third portions of bit lines between the cell array region and the page buffer region may be tilted to couple first portions to be shifted to second portions not to be shifted. As described above with reference to FIGS. 1 to 4, at least one of the bit lines may have an outwardly curved structure.

The multilayer metal lines of the cell array region CAR may be shifted and the page buffer region PBR may not be shifted and maintain its existing layout. Since the contact plugs in the cell array region are coupled to the same bit lines as the contact plugs in the page buffer region, in the above-described cell array region CAR, the shifting distances s1, s2, s3, and s4 of the contact plugs CTP0 to CTP8 may correspond to distances by which the contact plugs CTP0 to CTP8 in the cell array region CAR are shifted with respect to the contact plugs CT0 to CT8 in the page buffer region PBR.

This will be described in more detail with reference to FIGS. 9 and 10.

Figure 9:
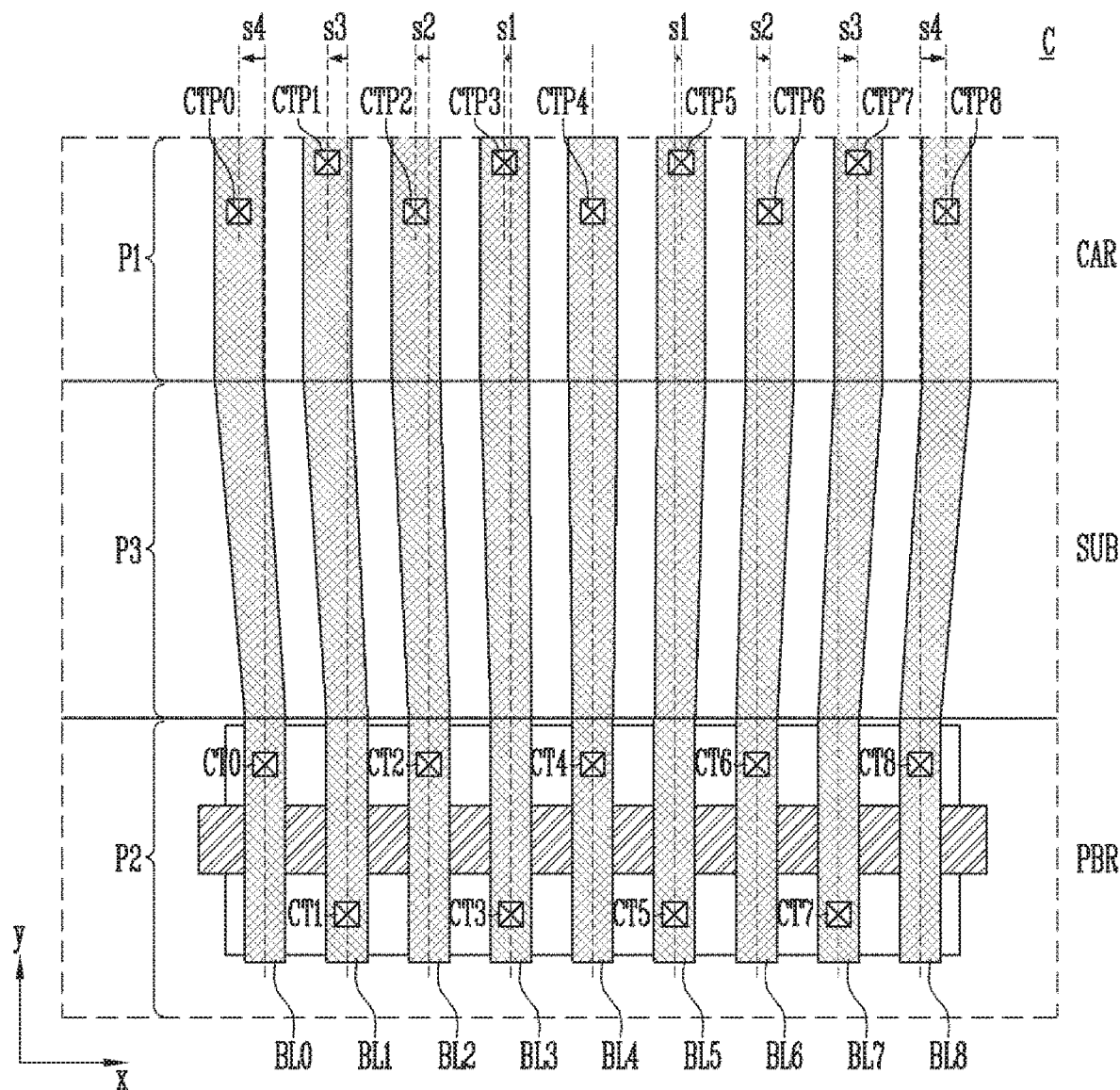
FIG. 9 is a view showing positions of contact plugs over a cell array region and contact plugs over a page buffer region according to an embodiment of the present invention.

FIG. 9 is a view showing positions of contact plugs over a cell array region and contact plugs over a page buffer region according to an embodiment.

Referring to FIG. 9 to which bidirectional shifting is applied, the contact plugs CTP0 to CTP8 in the cell array region CAR according to an embodiment may be shifted with respect to the contact plugs CT0 to CT8 in the page buffer region PBR according to the bending tendency of the cell plugs. The shifting direction may be a direction toward the word line contact region WCTR where the stepwise stacked structure is formed.

For example, the contact plug CTP5 may be shifted from the contact plug CT5 by the distance s1 in a direction from the center of the cell array region toward the right edge (i.e., toward the right word line contact region). The contact plug CTP6 may be shifted with respect to the contact plug CT6 by the distance s2 in the above direction. The contact plug CTP7 may be shifted with respect to the contact plug CT7 by the distance s3 in the above direction. In addition, the contact plug CTP8 may be shifted with respect to the contact plug CT8 by the distance s4 in the above direction. The contact plug CTP4 located at the center may be arranged collinearly with the contact plug CT4 in the cell array region CAR.

The contact plugs CTP0 to CTP3 and the contact plugs CTP5 to CTP8 may be vertically symmetric with respect to the contact plug CTP4 since the word line contact region is defined at both sides of the cell array region. More specifically, the contact plug CTP3 may be shifted with respect to the contact plug CT3 by the distance s1 in a direction from the center of the cell array region to the left edge (i.e., toward the left word line contact region). The contact plug CTP2 may be shifted with respect to the contact plug CT2 by the distance s2 in the above direction. The contact plug CTP1 may be shifted with respect to the contact plug CT1 by the distance s3 in the above direction. The contact plug CTP0 may be shifted with respect to the contact plug CT0 by the distance s4 in the above direction.

Figure 10:
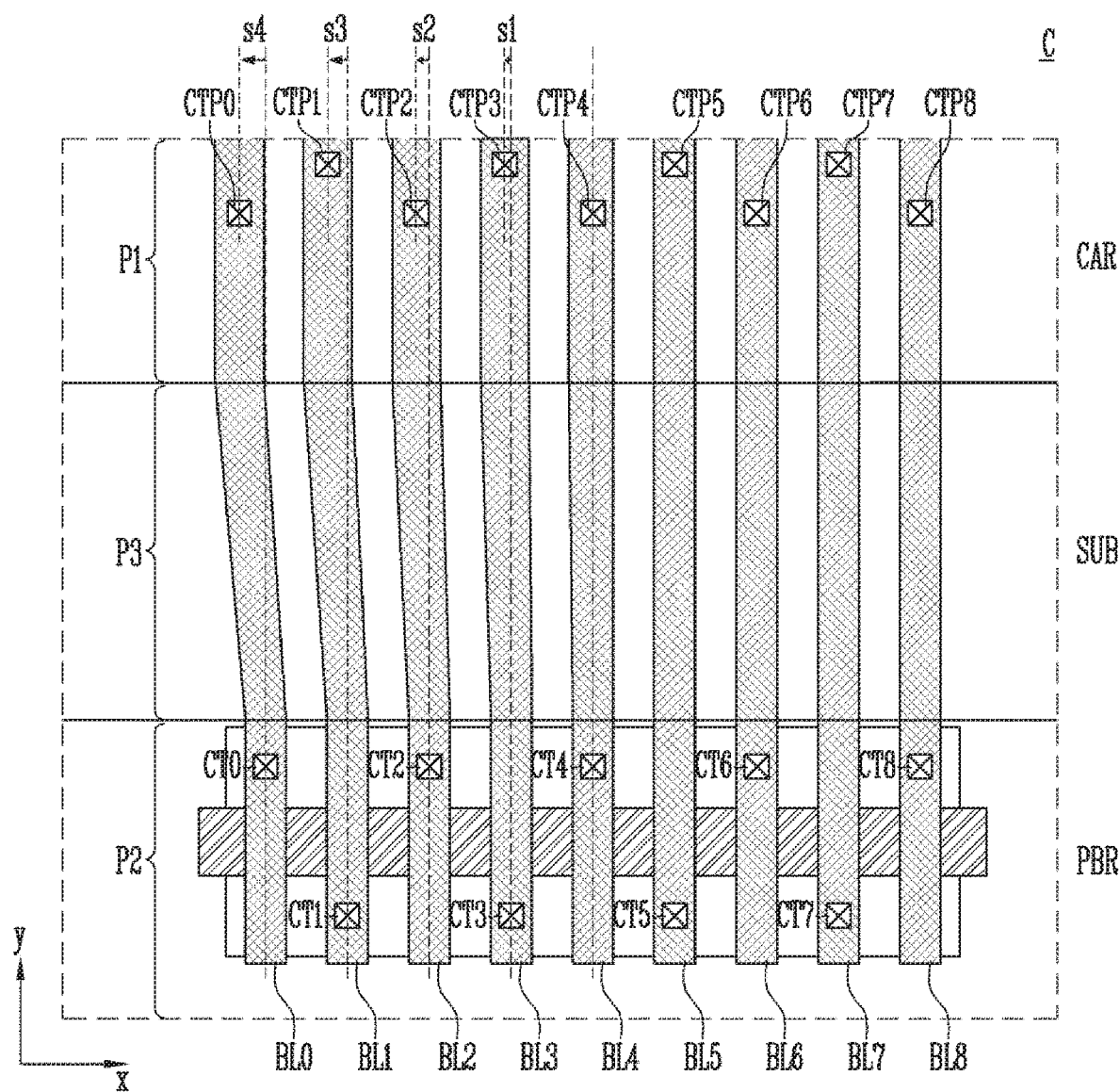
FIG. 10 is a view showing positions of contact plugs over a cell array region and contact plugs over a page buffer region according to another embodiment of the present invention.

FIG. 10 is a view showing positions of contact plugs over a cell array region and contact plugs over a page buffer region according to another embodiment. Referring to FIG. 10 to which unidirectional shifting is applied, the same description about the contact plugs CTP0 to CTP4 and CT0 to CT4 described above with reference to FIG. 9 may also apply to those in FIG. 10.

Hereinafter, an etch mask for obtaining a curved bit line structure according to an embodiment will be described with reference to FIGS. 11A to 13. For convenience of explanation, a memory cell in which the word line contact region WCTR is defined at both sides of the cell array region CAR will be described first.

Figure 11A:
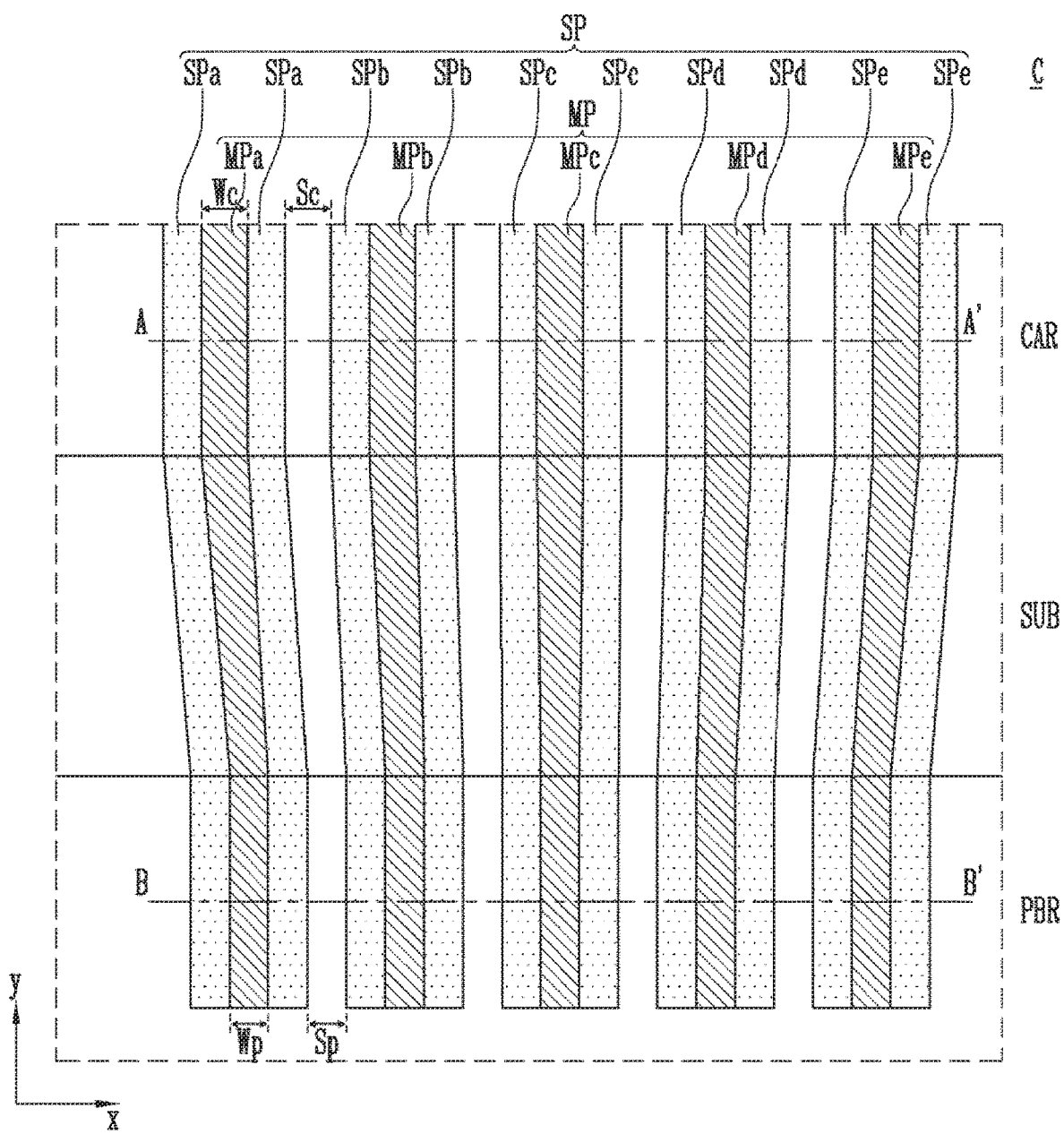
FIG. 11A is a plan view illustrating an etch mask according to an embodiment which is applicable to a portion C of FIG. 1.
Figure 11B:
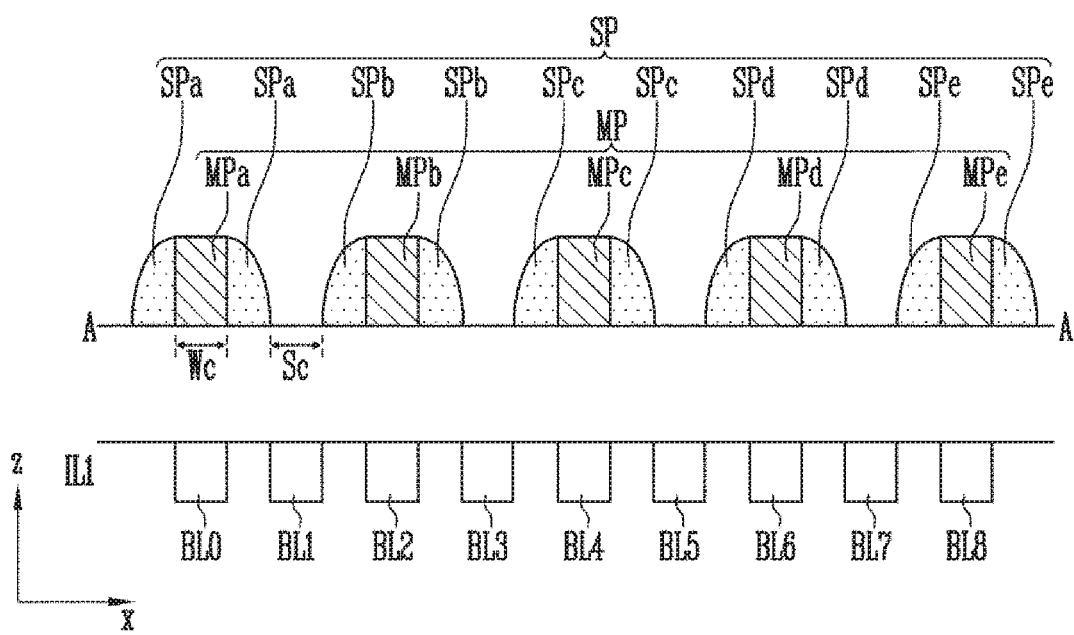
FIG. 11B is a cross-sectional view of an etch mask taken along line A-A' of FIG. 11A and bit lines formed thereunder through the etch mask.

FIG. 11A is a plan view illustrating an etch mask according to an embodiment which is applicable to the portion C shown in FIG. 1. FIG. 11B is a cross-sectional view of the etch mask taken along line A-A' of FIG. 11A for illustrating the bit lines BL0 to BL8 formed thereunder. In addition, FIG. 11C is a cross-sectional view of the etch mask taken along line B-B' of FIG. 11A for illustrating the bit lines BL0 to BL8 formed thereunder.

Figure 11C:
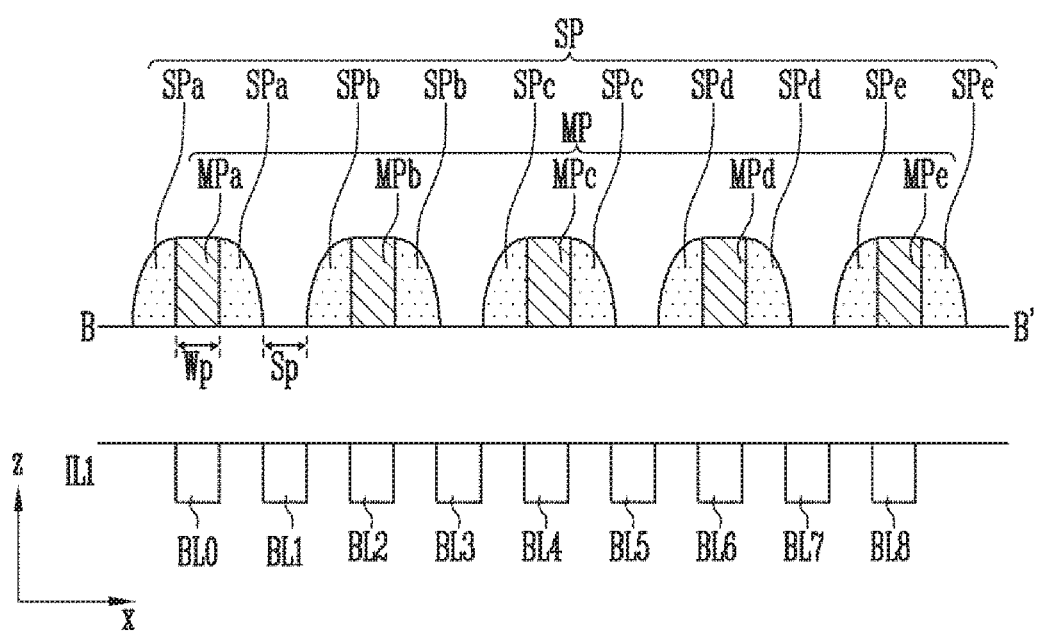
FIG. 11C is a cross-sectional view of an etch mask taken along line B-B' of FIG. 11A and bit lines formed thereunder through the etch mask.

Referring to FIGS. 11A to 11C, a first mask pattern MP may be formed over the cell array region CAR and the page buffer region PBR. In addition, a spacer SP may be formed on sidewalls of the first mask pattern MP. To form the spacer SP, a spacer material layer (not illustrated) may be conformally coated over the entire surface of the first mask pattern MP and anisotropically etched. The spacer material layer (not illustrated) may have an etch selectivity with respect to the first mask pattern MP (for example, a silicon oxide). The spacer material layer may be formed by a known method, such as ALD or CVD.

Subsequently, after the mask pattern MP is removed, an insulating layer IL1 may be etched using the spacer SP as the etch mask to form trenches. Subsequently, the bit lines BL0 to BL8 may be formed by filling the trenches with a metal material. As described above, for convenience of explanation, it is assumed that there are a total of nine bit lines BL0 to BL8. Therefore, to form the nine bit lines, the first mask pattern MP may include five polygonal patterns MPa to MPe, and the spacer SP may include five spacer pairs SPa to Spe formed on respective sidewalls of the polygonal patterns MPa to MPe.

As described above, the first portions P1 of the bit lines located in the cell array region CAR may be shifted, while the second portions P2 of the bit lines in the page buffer region PBR may not be shifted. In addition, slopes of the third portions P3 of the bit lines between the cell array region CAR and the page buffer region PBR may increase from the center to the edge so as to couple the first portions and the second portions. Therefore, a curved bit line structure may be formed. To form this curved bit line structure, an etch mask according to an embodiment may be formed as below.

The polygonal patterns MPa to MPe of the first mask pattern MP may be formed such that a line width Wc of each of the polygonal patterns MPa to MPe in the cell array region CAR may be greater than a line width Wp of each of the polygonal patterns in the page buffer region PBR (i.e., Wc>Wp). The polygonal patterns in the cell array region CAR may have the same line width. Also, the polygonal patterns in the page buffer region PBR may have the same line width.

At the same time, the spacer pairs SPa to Spe of the spacer SP may be formed such that distances Sc between the spacer pairs in the cell array region CAR may be greater than distances Sp between the spacer pairs in the page buffer region PBR (i.e., Sc>Sp). The spacer pairs in the cell array region CAR may have the same distance. Also, the spacer pairs in the page buffer region PBR may have the same distance.

In addition, the polygonal patterns MPa to MPe and the spacer pairs SPa to Spe may be vertically symmetrical to each other with respect to the center since the word line contact region WCTR is defined at both sides of the cell array region CAR. For example, the polygonal patterns MPa and MPb and the polygonal patterns MPd and MPe may be vertically symmetric with respect to a polygonal pattern MPc located at the center, and spacer pairs SPa and SPb and spacer pairs SPd and SPe may be vertically symmetric to each other with respect to a spacer pair SPc. When the word line contact region is defined at one side of the cell array region, the etch mask may have a curved structure in one direction in which the word line contact region is formed, which will be described with reference to FIG. 13.

The spacer pairs SPa to Spe may have the same line width.

As described above, the line widths of the polygonal patterns MPa to MPe and the distances between the spacer pairs SPa to Spe in the cell array region CAR may be greater than those in the page buffer region PBR, and the polygonal patterns MPa to MPe and the spacer pairs SPa to Spe may be vertically symmetric with respect to the center. Subsequently, after the polygonal patterns are removed, the insulating layer IL1 may be removed using the spacer pairs as an etch mask to form trenches, and the trenches may be filled with a metal material. As a result, the bit lines BL0 to BL8 may be formed such that the bit lines BL0 to BL8 may be shifted in the cell array region CAR as shown in FIG. 11B and may not be shifted in the page buffer region PBR as shown in FIG. 11C. In addition, the third portions P3 of the bit lines coupling the shifted first portions P1 and the unshifted second portions P2 to each other may have slopes increasing from the center to the edge between the cell array region CAR and the page buffer region PBR. Therefore, the curved bit line structure may be obtained.

Figure 12A:
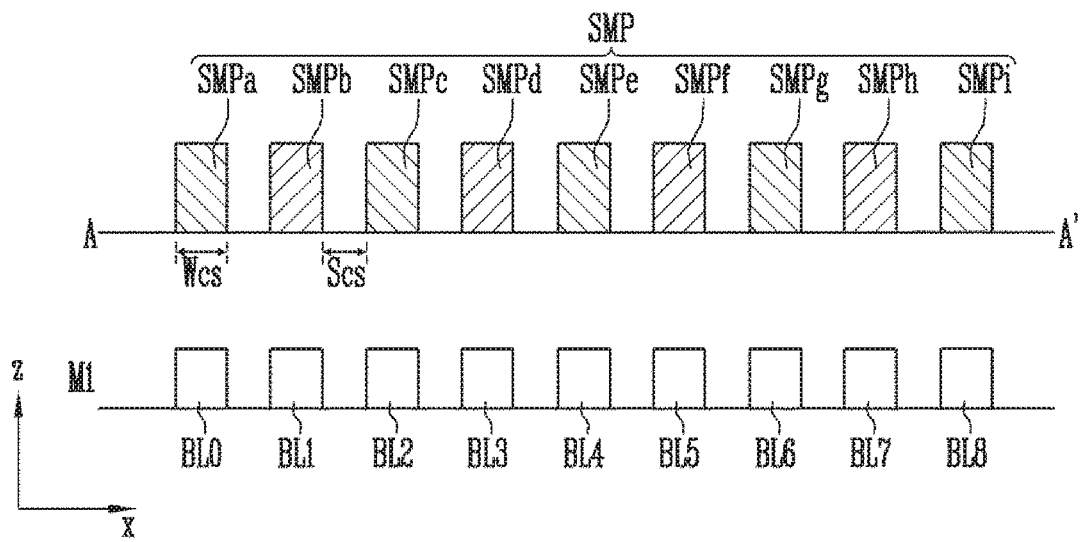
FIG. 12A is a cross-sectional view of an etch mask for illustrating bit lines formed thereunder when a metal layer is etched instead of an insulating layer shown in FIG. 11B.
Figure 12B:
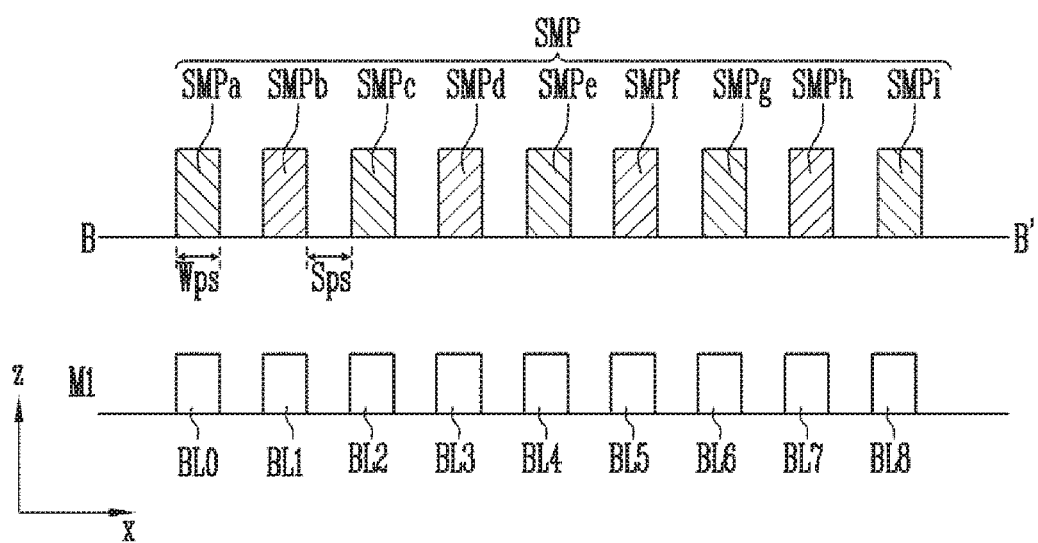
FIG. 12B is a cross-sectional view of an etch mask and bit lines formed thereunder when a metal layer is etched instead of an insulating layer shown in FIG. 11C.

Alternatively, the bit lines BL0 to BL8 may be formed by directly etching a metal layer M1 instead of the insulating layer IL1. FIG. 12A is a cross-sectional view of an etch mask when a metal layer is etched instead of the insulating layer shown in FIG. 11B for illustrating bit lines formed thereunder. In addition, FIG. 12B is a cross-sectional view of an etch mask when a metal layer is etched instead of the insulating layer shown in FIG. 11C for illustrating bit lines formed thereunder. As shown in FIGS. 12A and 12B, a second mask pattern SMP may include nine polygonal patterns SMPa to SMPi to form the nine bit lines. A line width Wcs of each of the polygonal patterns SMPa to SMPi of the second mask pattern SMP in the cell array region CAR may be greater than a line width Wps of each of the polygonal patterns SMPa to SMPi of the second mask pattern SMP in the page buffer region PBR (i.e., Wcs>Wps).

Distances Scs between the polygonal patterns SMPa to SMPi of the second mask pattern SMP in the cell array region CAR may be substantially the same as distances Sps between the polygonal patterns SMPa to SMPi of the second mask pattern SMP in the page buffer region PBR (i.e., Scs=Sps). In this regard, the spacer pairs SPa to Spe as described above with reference to FIGS. 11A to 11C may have substantially the same line width. By etching the metal layer M1 using the nine polygonal patterns SMPa to SMPi as an etch mask, the bit lines BL0 to BL8 may be formed such that the bit lines BL0 to BL8 may be shifted in the cell array region as shown in FIG. 12A and may not be shifted in the page buffer region as shown in FIG. 12B. In addition, slopes of the bit lines may increase from the center to the edge between the cell array region and the page buffer region. Therefore, a curved bit line structure may be obtained.

By forming the curved bit line structure using the above etch masks, changes in design of the peripheral circuit region as well as the page buffer region may be minimized.

Figure 13:
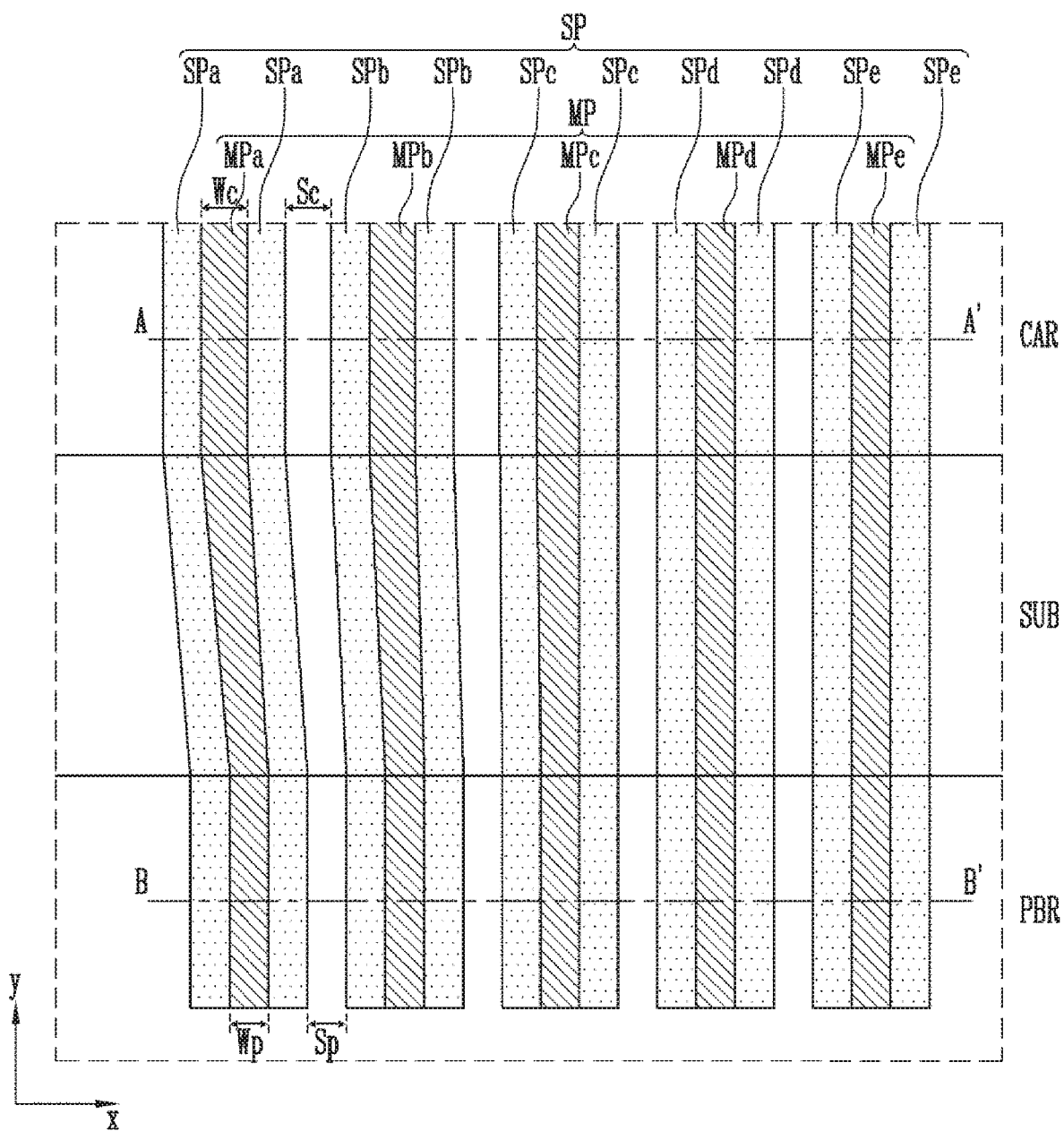
FIG. 13 is a plan view illustrating an etch mask according to another embodiment which is applicable to a portion C shown in FIG. 2.

FIG. 13 is a plan view of an etch mask according to another embodiment which is applicable to the portion C shown in FIG. 2. The etch mask of FIG. 13 may be provided to form a unidirectional curved structure, not the bidirectional curved structure described above with reference to FIGS. 11A to 12B.

The same descriptions may apply to FIG. 13, except that the etch mask described above with reference to 11A to 12B is now structured in one direction, not in both directions. More specifically, only the polygonal patterns (e.g., MPa and MPb) close to one side where the word line contact region is defined may have greater line widths in the cell array region than in the page buffer region (i.e., Wc>Wp). On the other hand, line widths of polygonal patterns (e.g., MPd and MPe) away from the word line contact region may remain unchanged. Only the spacer pairs close to one side where the word line contact region is defined may have greater distances (e.g., the distance between Spa and SPb and the distance between SPb and SPc) in the cell array region than in the page buffer region (i.e., Sc>Sp). On the other hand, distances between the spacer pairs away from the word line contact region (e.g., the distance between SPc and SPd and the distance between SPd and SPe) may remain unchanged.

As described above, the line widths of the polygonal patterns and the distances between the spacer pairs which are close to the word line contact region on the basis of the center may be greater in the cell array region than in the page buffer region. Subsequently, after the polygonal patterns are removed, the insulating layer may be etched using the spacer pairs as an etch mask to form trenches, and the trenches may be filled with a metal material. As a result, bit lines that are shifted in the cell array region and are not shifted in the page buffer region may be formed, so that a unidirectional curved bit line structure toward one side where the word line contact region is defined may be formed.

Figure 14:
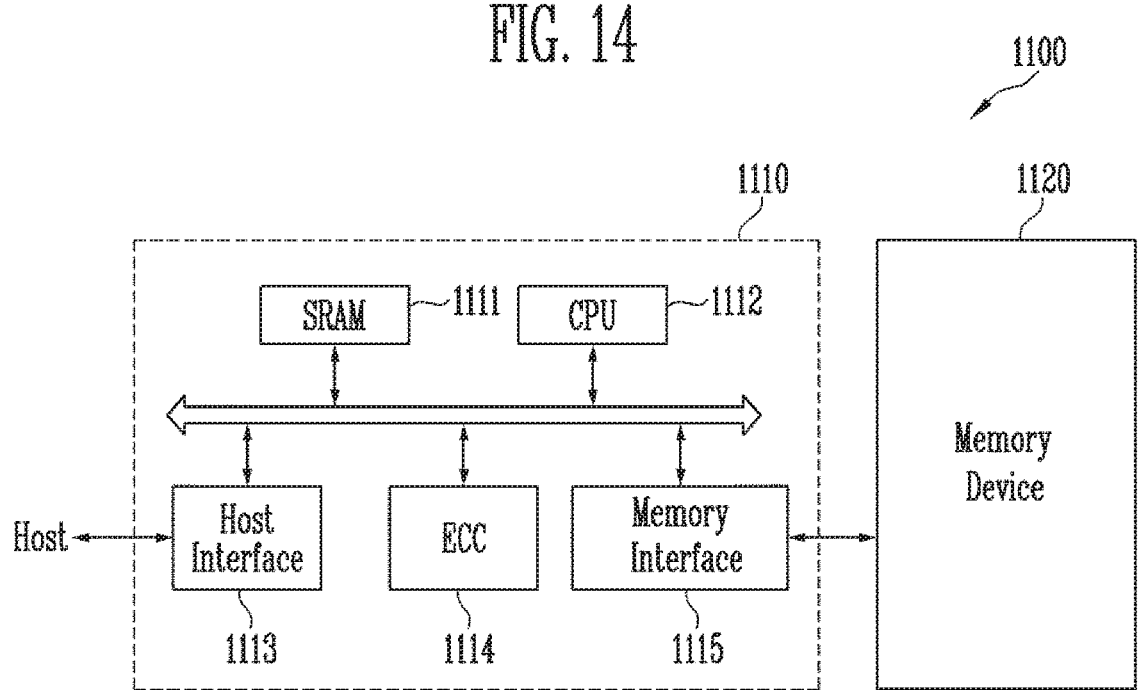
FIG. 14 is block diagram illustrating an exemplary configuration of a memory system according to an embodiment of the present invention.

FIG. 14 is a block diagram illustrating a memory system 1100 according to an embodiment.

Referring to FIG. 14, the memory device 1100 may include a memory device 1120 and a memory controller 1110.

The memory device 1120 may have the structure described above with reference to FIGS. 1 to 13. For example, the memory device 1120 may have a curved structure in which at least a portion of bit lines may be outwardly curved, and multilayer metal lines for forming contact plugs and the bit lines may be shifted in a cell array region. In addition, the memory device 1120 may be a multi-chip package including a plurality of flash memory chips.

The memory controller 1110 may be configured to control the memory device 1120. The memory controller 1110 may include static random access memory (SRAM) 1111, a central processing unit (CPU) 1112, a host interface 1113, an error check and correction unit (ECC) 1114 and a memory interface 1115. The SRAM 1111 may function as an operation memory of the CPU 1112. The CPU 1112 may perform general control operations for data exchange with the memory controller 1110. The host interface 1113 may include a data exchange protocol for a host coupled to the memory system 1100. In addition, the ECC 1114 may detect and correct errors included in data read from the non-volatile memory device 1120. The memory interface 1115 may interface between the non-volatile memory device 1120 and a memory controller 1110. The memory controller 1110 may further include a read-only memory (ROM) that stores code data to interface with the host.

The memory system 1100 having the above-described configuration may be a solid state disk (SSD) or a memory card in which the memory device 1120 and the memory controller 1110 are combined. For example, when the memory system 1100 is an SSD, the memory controller 1110 may communicate with an external device (e.g., a host) through one of the interface protocols including Universal Serial Bus (USB), MultiMedia Card (MMC), Peripheral Component Interconnection-Express PCI-E( ), Serial Advanced Technology Attachment (SATA), Parallel Advanced Technology Attachment (PATA), Small Computer Small Interface (SCSI), Enhanced Small Disk Interface (ESDI), and Integrated Drive Electronics (IDE).

Figure 15:
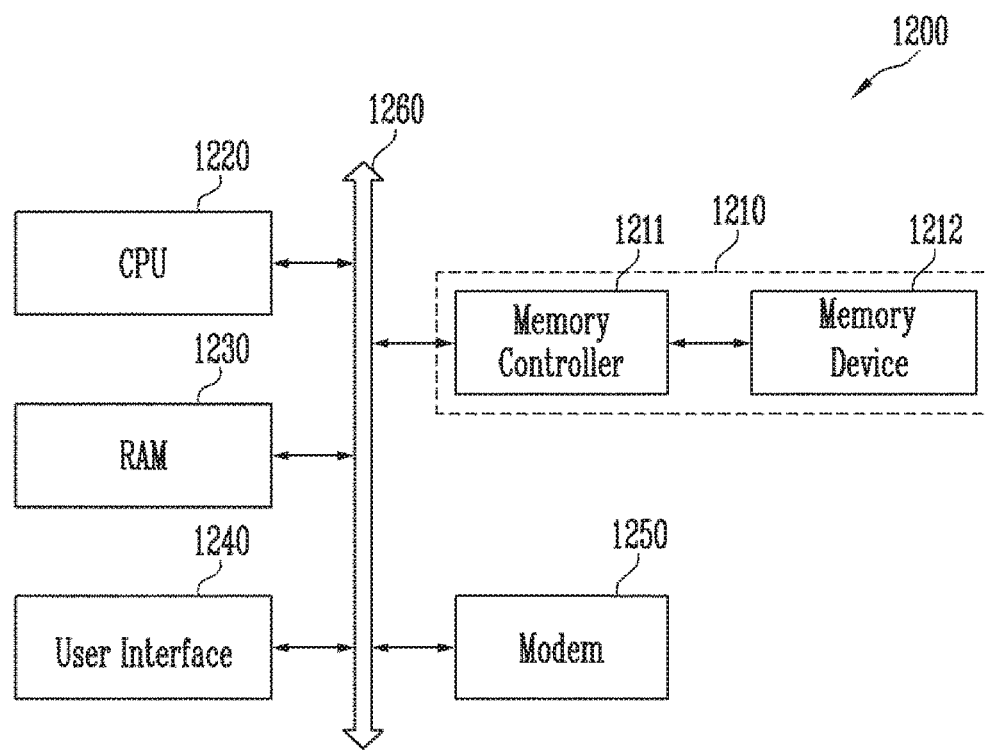
FIG. 15 is a block diagram illustrating an exemplary configuration of a computing system according to an embodiment.

FIG. 15 is a block diagram illustrating the configuration of a computing system 1200 according to an embodiment.

Referring to FIG. 15, the computing system 1200 may include a CPU 1220, a RAM 1230, a user interface 1240, a modem 1250 and a memory system 1210 that are electrically coupled to each other by a system bus 1260. In addition, when the computing system 1200 is a mobile device, a battery may be further included to apply an operating voltage to the computing system 1200. The computing system 1200 may further include application chipsets, a Camera Image Processor (CIS), or a mobile DRAM.

As described above in connection with FIG. 14, the memory system 1210 may include a non-volatile memory 1212 and a memory controller 1211.

The present invention provides an improved three-dimensional, semiconductor device which reduces and or prevents misalignment between a cell plug and a corresponding contact plug caused by a cell plug bending phenomenon. The improved three-dimensional semiconductor device exhibits improved operational reliability by substantially reducing or eliminating the risk of malfunctioning due to misalignment of the cell plugs and corresponding contact plugs of the semiconductor memory device.

Moreover, the number of stacked layers that can be included in a semiconductor device may be increased.

In addition, according to an embodiment, a bit line leakage current may be reduced and the number of dummy cell plugs may be reduced.

In addition, according to an embodiment, changes in design of a peripheral circuit region may be reduced.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A method of manufacturing a semiconductor memory device comprising:
   forming bit lines on a substrate, wherein the substrate includes a cell array region, a word line contact region and a page buffer region;
   wherein the page buffer region is coupled to the cell array region through bit lines,
   wherein the bit lines include a first bit line and a second bit line, and
   wherein the second bit line has a curved structure toward the word line contact region and a curvedness of the second bit line is greater than a curvedness of the first bit line.

2. The method of claim 1, wherein the bit lines have a curved structure and curvedness of the bit lines increases toward the word line contact region.

3. The method of claim 1, wherein curvedness of the bit lines increases in a direction from a center toward at least one bit line located over one edge and/or the other edge of the cell array region.

4. The method of claim 1,
   wherein the word line contact region is located on at least one of a first side of the cell array region and a second side of the cell array region opposite to the first side, and
   wherein the page buffer region is located at a third side coupling the first and second sides of the cell array region.

5. The method of claim 1, wherein the bit lines extend over the cell array region and the page buffer region.

6. The method of claim 1, wherein each of the bit lines includes a first portion placed on the cell array region, a second portion placed on the page buffer region, and a third portion placed between the cell array region and the page buffer region, the third portion connecting the first and second portions of each bit line.

7. The method of claim 6, wherein two or more of third portions of the bit lines have different shapes from each other.

8. The method of claim 6, wherein two or more of third portions of the bit lines have slopes increasing in a direction from a third portion located at a center toward at least one of a third portion located at one edge and a third portion located at the other edge.

9. The method of claim 6, wherein at least one of first portions of the bit lines has a greater line width than at least one of second portions thereof.

10. The method of claim 6, wherein a line width of at least one of third portions increases towards the word line contact region.

11. The method of claim 6, wherein at least one of distances between first portions is the same as at least one of distances between second portions.

12. The method of claim 1, further comprising:
   forming a stepwise stacked structure in the word line contact region,
   wherein the stepwise stacked structure includes interlayer insulating layers and conductive layers alternately stacked on the substrate.

13. The method of claim 1, wherein the forming of the bit lines comprises:
   forming an insulating layer over the substrate;
   forming a plurality of mask patterns on the insulating layer at the cell array region and the page buffer region;
   forming a plurality of spacer pairs on respective sidewalls of the mask patterns;
   removing the mask patterns;
   forming trenches in the insulating layer by etching the insulating layer using the spacer pairs as an etch barrier; and
   forming the bit lines in the trenches, respectively.

14. The method of claim 13, wherein at least one of the mask patterns has a greater width in the cell array region than in the page buffer region, and wherein at least one of the spacer pairs has a greater distance in the cell array region than in the page buffer region.

15. A method of manufacturing a semiconductor memory device comprising:
    forming a stacked structure on a substrate, wherein the stacked structure includes word lines stacked on a cell array region a substrate and cell plugs, wherein the substrate includes the cell array region, a word line contact region and a page buffer region;
    forming first contact plugs coupled to the cell plugs in the cell array region;
    forming second contact plugs coupled to transistors in the page buffer region; and
    forming bit lines coupling the first contact plugs and the second plugs so that the page buffer region is coupled to the cell array region through the bit lines,
    wherein one of the first contact plugs is shifted to the word line contact region with respect to a corresponding second contact plug and a distance by which the one of the first contact plugs is shifted with respect to the corresponding second contact plug is greater than a distance by which another first contact plug is shifted with respect to a corresponding second contact plug.

16. The method of claim 15, wherein the distance by which the one of the first contact plugs is shifted increases toward the word line contact region.

17. A method of manufacturing a semiconductor memory device comprising:
    forming a stacked structure on a substrate, wherein the stacked structure includes cell plugs extending from a substrate and conductive layers surrounding the cell plugs and extending in a first direction; and
    forming bit lines coupled to the cell plugs and extending in a second direction crossing the first direction,
    wherein the bit lines include a first bit line and a second bit line adjacent to each other in the first direction, and
    wherein the second bit line has a curved structure in the first direction and a curvedness of the second bit line is greater than a curvedness of the first bit line.

18. The method of claim 17, wherein curvedness of the bit lines increases in the first direction.

19. The method of claim 17, wherein the conductive layers extend in the first direction to form a stepwise structure.

20. A method of manufacturing a semiconductor memory device comprising:
    forming an insulating layer over a substrate, wherein the substrate includes a cell array region and a page buffer region;
    forming a plurality of mask patterns over the insulating layer at the cell array region and the page buffer region;
    forming a plurality of spacer pairs on respective sidewalls of the mask patterns;
    removing the mask patterns;
    forming trenches in the insulating layer by etching the insulating layer using the spacer pairs as an etch barrier; and
    forming the bit lines in the trenches, respectively,
    wherein at least one of the mask patterns has a greater width in the cell array region than in the page buffer region,
    wherein at least one of the spacer pairs has a greater distance in the cell array region than in the page buffer region, and
    wherein the bit lines include a first bit line and a second bit line, the second bit line has a curved structure and a curvedness of the second bit line is greater than a curvedness of the first bit line.

* * * * *